United States Patent
Nomura et al.

(10) Patent No.: US 9,214,783 B2
(45) Date of Patent: Dec. 15, 2015

(54) LIGHT EMITTING DEVICE, LIGHTING SYSTEM, HEADLIGHT, AND VEHICLE

(75) Inventors: Masaru Nomura, Osaka (JP);
Yoshifumi Yaoi, Osaka (JP);
Kohichiroh Adachi, Osaka (JP);
Kohtaroh Kataoka, Osaka (JP);
Takeshi Shiomi, Osaka (JP); Hiroshi Iwata, Osaka (JP); Yoshiji Ohta, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 210 days.

(21) Appl. No.: 14/004,527

(22) PCT Filed: Mar. 5, 2012

(86) PCT No.: PCT/JP2012/055565
§ 371 (c)(1),
(2), (4) Date: Sep. 11, 2013

(87) PCT Pub. No.: WO2012/124522
PCT Pub. Date: Sep. 20, 2012

(65) Prior Publication Data
US 2014/0009952 A1 Jan. 9, 2014

(30) Foreign Application Priority Data
Mar. 15, 2011 (JP) .................................. 2011-057235

(51) Int. Cl.
*F21S 8/10* (2006.01)
*H01S 5/00* (2006.01)
(Continued)

(52) U.S. Cl.
CPC ................. *H01S 5/00* (2013.01); *F21S 48/115* (2013.01); *F21S 48/1159* (2013.01); *F21V 9/16* (2013.01);
(Continued)

(58) Field of Classification Search
CPC ... H01S 5/06825; H01S 5/005; H01S 5/0078; H01S 5/042; H01S 5/4018; F21Y 2101/025
USPC ........................................................ 372/38.09
See application file for complete search history.

(56) References Cited

U.S. PATENT DOCUMENTS

| 5,219,444 | A | 6/1993 | Chiaramonte et al. |
| 6,697,402 | B2 * | 2/2004 | Crawford ................... 372/38.03 |

(Continued)

FOREIGN PATENT DOCUMENTS

| JP | 59-195891 A | 11/1984 |
| JP | 05-6507 U | 1/1993 |

(Continued)

OTHER PUBLICATIONS

Official Communication issued in International Patent Application No. PCT/JP2012/055565, mailed on May 22, 2012.
(Continued)

*Primary Examiner* — Armando Rodriguez
(74) *Attorney, Agent, or Firm* — Keating & Bennett, LLP

(57) ABSTRACT

A light emitting device which includes at least one of a laser light source (1), wiring (9), a lens for excitation (2), a luminous body (4), a laser cut filter (6), a half parabolic mirror (5P), and a base (5h), in which a part of the wiring (9) is installed at a portion in which a breakage easily occurs due to at least one deformation of the laser light source (1), the lens for excitation (2), the luminous body (4), the laser cut filter (6), the half parabolic mirror (5P), and the base (5h), or a change in an installation position thereof.

20 Claims, 15 Drawing Sheets

(51) Int. Cl.
*H01S 5/042* (2006.01)
*F21V 9/16* (2006.01)
*F21Y 101/02* (2006.01)
*H01S 5/068* (2006.01)
*H01S 5/40* (2006.01)

(52) U.S. Cl.
CPC ............ *F21Y 2101/025* (2013.01); *H01S 5/005* (2013.01); *H01S 5/0078* (2013.01); *H01S 5/042* (2013.01); *H01S 5/06825* (2013.01); *H01S 5/4018* (2013.01)

(56) References Cited

U.S. PATENT DOCUMENTS

| | | |
|---|---|---|
| 2006/0244396 A1 | 11/2006 | Bucur |
| 2008/0150439 A1 | 6/2008 | Bucur |
| 2009/0174929 A1 | 7/2009 | Egawa |
| 2011/0084609 A1 | 4/2011 | Kawaguchi et al. |

FOREIGN PATENT DOCUMENTS

| | | |
|---|---|---|
| JP | 5-242703 A | 9/1993 |
| JP | 6-9096 U | 2/1994 |
| JP | 2008-73346 A | 4/2008 |
| JP | 2009-10100 A | 1/2009 |
| JP | 2009-59641 A | 3/2009 |
| JP | 2009-146938 A | 7/2009 |
| JP | 2009-164443 A | 7/2009 |
| JP | 2009-212493 A | 9/2009 |
| JP | 2010-118267 A | 5/2010 |
| JP | 2011-86432 A | 4/2011 |

OTHER PUBLICATIONS

Official Communication issued in corresponding Japanese Patent Application No. 2013-504661, mailed on Jun. 23, 2015.

\* cited by examiner

LIGHT EMITTING DEVICE, LIGHTING SYSTEM, HEADLIGHT, AND VEHICLE

TECHNICAL FIELD

The present invention relates to a light emitting device which uses a semiconductor laser diode (LD) as a light source, a lighting system including the light emitting device, a headlight, and a vehicle including the headlight.

BACKGROUND ART

In recent years, a study of a light emitting device using an LD as a light source, or the like has been popular. Laser light which is generated from the LD has high directivity, and there is a possibility of damaging retina when being input to human eyes. For this reason, it is necessary to devise a technology in which laser light which is generated from the LD is not leaked to the outside of a device as far as possible.

In addition, in an electronic endoscope device which is disclosed in PTL 1, a detecting resistor for detecting a breakage or a short circuit of a power line is inserted into the power line, and energization of an LD is cut off based on a comparison result between a detection potential by the detecting resistor and a reference potential.

In addition, in a laser unit which is disclosed in PTL 2, a strain amount which occurs in a light guiding path through which laser light passes is detected, and energization of an LD is cut off based on the detection result.

In addition, in a light emitting device which is disclosed in PTL 3, an LD is provided in sealing means, ambient air which comes into the sealing means is detected, and energization of the LD is cut off based on the detection result.

In addition, in a light source unit which is disclosed in PTL 4, emission of harmonic light to the outside of a device is prevented using falling of a temperature of a second harmonic generation element by separating the second harmonic generation element which emits the harmonic light by converting a wavelength of laser light from a heater which controls the temperature thereof. In addition, a wavelength conversion efficiency from the laser light to the harmonic light in the second harmonic generation element is decreased when the temperature falls.

In addition, a light source device which is disclosed in PTL 5 includes a package configured by a first structure body and a second structure body for accommodating a light source unit, a package wiring unit is formed on the surface of the first structure body, a breakage of the package wiring unit is detected in a detecting circuit, and energization of the light source unit is cut off.

CITATION LIST

Patent Literature

PTL 1: Japanese Unexamined Patent Application Publication No. 2008-73346 (Publication Date: Apr. 3, 2008)
PTL 2: Japanese Unexamined Patent Application Publication No. 59-195891 (Publication Date: Nov. 7, 1984)
PTL 3: Japanese Unexamined Patent Application Publication No. 2009-146938 (Publication Date: Jul. 2, 2009)
PTL 4: Japanese Unexamined Patent Application Publication No. 2009-164443 (Publication Date: Jul. 23, 2009)
PTL 5: Japanese Unexamined Patent Application Publication No. 2009-59641 (Publication Date: Mar. 19, 2009)

SUMMARY OF INVENTION

Technical Problem

However, in the technologies which are disclosed in PTLs 1 to 3, and PTL 5, since energization of an LD is cut off based on a detection result using a sensor, or a detecting circuit in any of the technologies, there is a problem in that a time lag occurs between the detection using the sensor, the detecting circuit, or the like and the cutting off of the energization of the LD.

For example, in the electronic endoscope device which is disclosed in PTL 1, since a breakage or a short circuit occurs in a power line, a time which is necessary until obtaining a comparison result between a detection potential and a reference potential in a detection resistor becomes at least a time lag.

On the other hand, in the light source device which is disclosed in PTL 4, since the second harmonic generation element and the heater are separated from each other, it takes a relatively long time until a temperature of the second harmonic generation element sufficiently falls (thermal response). For this reason, there is a problem in that a relatively long time lag is present until an emission of the harmonic light is stopped, since the second harmonic generation element and the heater are separated from each other. In addition, in the technology in the literature, a main object thereof is to prevent a module from being abused by being taken out, and safety or the like of the device in case of being broken or the like is not taken into consideration very much.

In addition, in the technologies which are disclosed in PTLs 1 to 3, when a device is broken before obtaining a detection result using a sensor or the like, due to an occurrence of an intentional or unforeseen accident, there is also a problem in that laser light occurring from an LD may leak to the outside of the device.

The present invention has been made in consideration of the problem in the related art, and an object thereof is to provide a light emitting device which can make a time lag occurring between an accident occurrence and cutting off of energizing of a semiconductor laser zero, or an instant which can be substantially neglected.

Solution to Problem

In order to solve the above problem, the light emitting device according to the present invention includes a laser light source which is configured by at least one semiconductor laser; wiring for supplying a current to the laser light source; and an optical member for changing a state of laser light which is emitted from the laser light source, in which a part of the wiring is installed at a portion at which a breakage easily occurs due to a deformation of at least one of the laser light source and the optical member, or a change in an installation position thereof.

According to the configuration, the light emitting device in the present invention includes a laser light source, wiring for supplying a current to the laser light source, and an optical member. In this manner, it is possible to make the laser light source emit laser light by supplying a current to the laser light source through the wiring. In addition, a state of the laser light which is emitted from the laser light source is changed due to the optical member.

Here, for example, a case in which an intentional or an unforeseen accident occurs in the light emitting device according to the present invention will be taken into consideration. At this time, there is a possibility that at least one of the laser light source and the optical member may be deformed, or the installation position thereof may be changed due to the accident. For this reason, for example, there is a possibility that laser light may be leaked to the outside of a device when an optical path of the laser light which is generated from the laser light source is changed, or an optical filter (an example of optical member) is not able to cut off laser light.

Therefore, in the above described configuration according to the present invention, a part of wiring for supplying a current to the laser light source is provided at a portion at which a breakage easily occurs due to a transformation of at least one of the laser light source and the optical member, or the change in the installation position thereof. Due to this, there is a high possibility that a part of wiring may be broken when at least one of the laser light source and the optical member is deformed, or the installation position thereof is changed. In addition, when a part of the wiring is broken, supplying of a current to the laser light source is instantly cut off. Accordingly, it is possible to make a time lag which occurs between an accident occurrence and cutting off of energization of a semiconductor laser zero, or an instant which can be substantially neglected compared to the technologies which are disclosed in PTLs 1 to 5.

In addition, the "laser light source" is configured by at least one semiconductor laser. In other words, the laser light source is configured by a single semiconductor laser, or a plurality of semiconductor lasers (which are connected to each other).

In addition, the "optical member" is a member changing a state of laser light which is emitted from the laser light source. As such an optical member, there is a prism, a lens, a wavelength conversion element, an optical filter, a diffraction grating, a polarizing plate, an optical path change member, or the like. In addition, the "lens" is a member which adjusts a spot diameter of laser light. In addition, the "wavelength conversion element" is a member which converts laser light into light with a different wavelength. The "optical filter" is a member which cuts off light with a wavelength in a predetermined wavelength range, and transmits light with a wavelength other than that. The "optical path change member" is a member which changes an optical path of laser light.

Advantageous Effects of Invention

As described above, a light emitting device according to the present invention includes a laser light source which is configured by at least one semiconductor laser; wiring for supplying a current to the laser light source; and an optical member for changing a state of laser light which is emitted from the laser light source, in which a part of the wiring is installed at a portion at which a breakage easily occurs due to a transformation of at least one of the laser light source and the optical member, or a change in an installation position thereof.

Therefore, it is possible to obtain an effect of making a time lag which occurs between an accident occurrence and cutting off of energization of a semiconductor laser zero, or an instant which can be substantially neglected.

Other objects, characteristics, and merits according to the present invention will be sufficiently understood from the following descriptions. In addition, the merits of the present invention will be clarified in the following description in which accompanying drawings are referred to.

DESCRIPTION OF EMBODIMENTS

Figure 1:
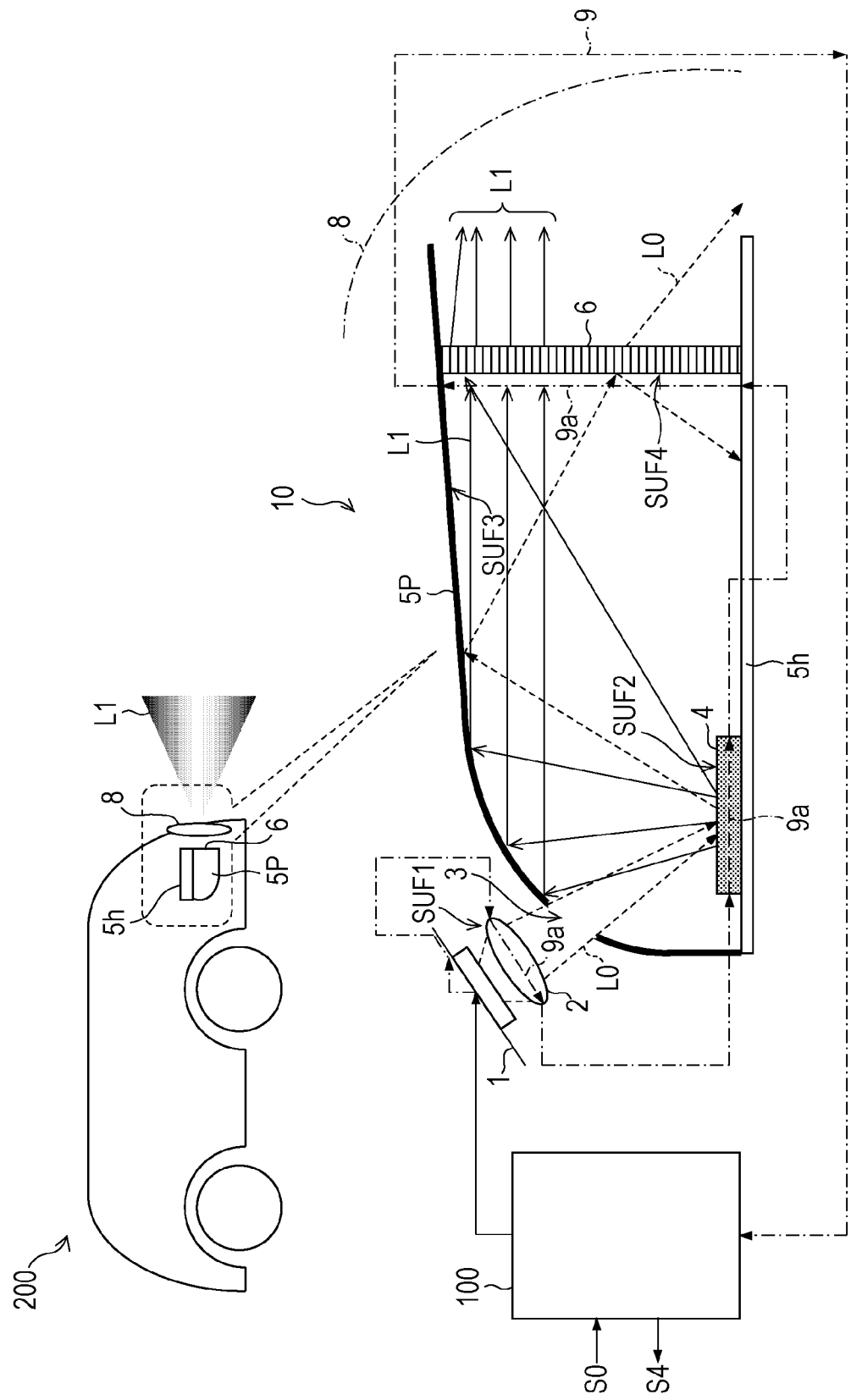
FIG. 1 is a diagram which illustrates a schematic configuration of a head lamp according to one embodiment of the present invention, and a vehicle including the head lamp.

One embodiment of the present invention will be described based on FIGS. 1 to 15 as follows. Descriptions of a configuration excluding configurations which will be described below in specified items may be omitted as necessary, however, when being described in other items, the same configuration will be applied thereto. In addition, for easy descriptions, members having the same function as the member which is illustrated in each item will be given the same reference numerals, and descriptions thereof will be appropriately omitted.

(Regarding Technology in Previous Application)

In a lighting system which is disclosed in the previous applications applied by an applicant of the present application (Japanese Patent Application No. 2009-237076 (filed on Oct. 14, 2009); Japanese Unexamined Patent Application Publication No. 2011-86432 (published on Apr. 28, 2011)), an optical sensor which detects reflected light from a fluorescent member, or an acceleration sensor which detects a collision is provided, and cuts off energization of an LD based on these detection result.

However, since the energization of the LD is cut off based on the detection result using the optical sensor, or the like in the technologies in the previous applications, there is a problem in that a time lag occurs between the detection using the optical sensor, or the like and the cutoff of energization of the LD.

For example, in the lighting system disclosed in the previous application, it is necessary to have a step of determining whether or not a detection voltage which is output from an optical sensor detecting reflected light exceeds a predetermined threshold value, and a time for the determining step becomes at least a time lag.

One embodiment of the present invention which will be described below has been made in consideration of the problem in the previous application, and an object thereof is to make a time lag which occurs between an accident occurrence and cutoff of energization of a semiconductor laser zero, or an instant which can be substantially neglected.

(Configuration of Head Lamp 10 and Vehicle 200)

First, configurations of a head lamp (light emitting device, lighting system, headlight) 10 and a vehicle (car) 200 according to one embodiment of the present invention will be described based on FIG. 1. FIG. 1 is a diagram which schematically illustrates configurations of the head lamp 10 and the vehicle 200. As illustrated in FIG. 1, the head lamp 10 includes at least a laser light source 1, a lens for excitation (optical member) 2, a luminous body (optical member) 4, a half parabolic mirror (reflecting mirror, optical member) 5P, a base (optical member) 5h, a laser cut filter (optical member) 6, a projection lens (optical member) 8, wiring 9, and a laser driving circuit 100.

Subsequently, the vehicle 200 includes the head lamp 10. In addition, as illustrated in the figure, it is preferable that the head lamp 10 be arranged at a head of the vehicle 200 so that the half parabolic mirror 5P is located vertically downward.

In the arranging method, the front of the vehicle 200 is lighted up brightly enough due to a projecting property of the half parabolic mirror 5P which will be described later, and it is possible to make the front lower side of the vehicle 200 bright, instead of useless radiating of light in the sky direction, and to obtain a preferable projecting property as the head lamp for a vehicle.

In addition, the head lamp 10 may be applied to a high beam headlight for vehicle, or a low beam headlight.

Subsequently, each constituent element of the head lamp 10 will be described based on FIGS. 1 to 3.

(Laser Light Source 1)

Figure 3:
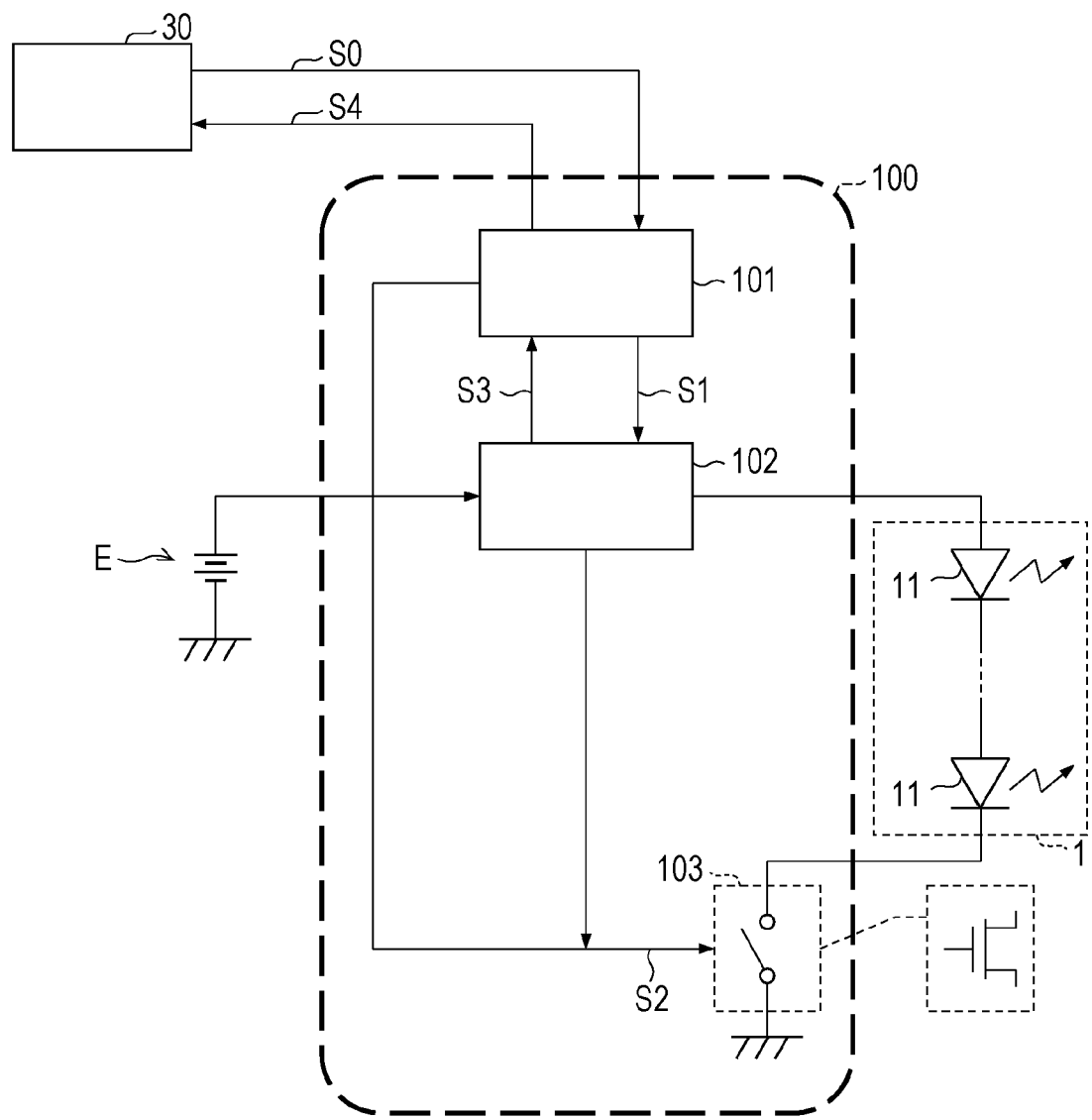
FIG. 3 is a block diagram which illustrates an example of a laser driving circuit in the head lamp.

The laser light source 1 is a light source which is configured by a single LD chip (semiconductor laser) 11 as illustrated in FIG. 3, or a plurality of LD chips 11 which are connected to each other.

In addition, the plurality of LD chips 11 may be connected in series to each other, may be connected in parallel to each other, and may be connected in series, and in parallel. In addition, according to the embodiment, the laser light source 1 in case of being configured by a signal LD chip 11, and in case of being configured by four LD chips 11 (semiconductor laser group) which are connected to each other in series will be described.

For the single LD chip 11, for example, as an optical output of one chip which oscillates laser light of 405 nm (bluish purple), a chip with a high electric power of approximately 5 to 10 W can be considered. In addition, as the LD chip 11, a chip with one light emitting point (one chip and one stripe) may be used, a chip with a plurality of light emitting points (one chip and a plurality of stripes, or a plurality of chips: for example, aggregation in which optical output of one stripe and one chip is 1.0 W, operation voltage is approximately 5 V, and current is approximately 0.7 A), or a plurality of chips with the same standard as the above in which each chip is enclosed in a package (stem) may be used. According to the embodiment, it is assumed that an LD chip 11 with a high output (approximately 5 to 10 W as optical output) in one chip and one stripe is used.

A wavelength of laser light which is oscillated by the LD chip 11 is not limited to 405 nm, and may have a peak wavelength (wavelength of peak light emission) in a wavelength range from a near ultraviolet region to a blue region (350 nm or more, 460 nm or less), and more preferably, from the near ultraviolet region to a bluish purple region (350 nm or more, 420 nm or less). The reason why is that light with a short wavelength easily excites a fluorescent material (having high energy as light) compared to light with a long wavelength, and there is a wide choice of selections (including conversion efficiency from laser light to fluorescence) for the fluorescent material of the luminous body 4 which will be described later, and when wavelengths of visible light which are used as illumination lights and laser lights are separated, it is easy to separate both using an optical filtering member, and safety can be further increased by reducing an amount of laser light which is mixed into the illumination light.

Even though it is a wavelength component of laser light, if it is possible to secure a safety by lowering a coherence property (coherency) of laser light by devising material properties of a luminous body which is used in the luminous body 4 which will be described later, and an optical component, there is a wide choice of selections of the wavelength of the laser light.

In addition, when a oxynitride-based or nitride-based fluorescent material, which will be described later, is used as a fluorescent material of the luminous body 4, it is preferable that an optical output of the LD chip 11 be 1 W or more and 20 W or less, and optical density of laser light which is radiated to the luminous body 4 be 0.1 W/mm$^2$ or more and 50 W/mm$^2$ or less. If the optical output is in the range, it is possible to realize a luminous flux and brightness which are required for the head lamp 10 for vehicle, and to prevent the luminous body 4 from deteriorating extremely due to laser light of a high output. That is, it is possible to realize a light source of high luminous flux and high brightness, and with a long life.

However, when a fluorescent material of the luminous body 4 with an excellent heat resistance, for example, fluorescent nanoparticles which will be described later are used as the fluorescent material of the luminous body 4, the optical density of the laser light which is radiated to the luminous body 4 may be larger than 50 W/mm$^2$. In addition, when a fluorescent material with an excellent heat resistance is used in the luminous body 4 without being limited to the fluorescent nanoparticles which will be described later, the optical output of the LD chip 11, or the optical density of the laser light which is radiated to the luminous body 4 may be larger than the above value. In addition, when a conversion efficiency of the luminous body 4 from the laser light to visible light is high, or a necessary optical output of the visible light may be small, an optical output of the LD chip 11, or the optical density of the laser light with respect to the luminous body 4 may be smaller than the above value.

(Regarding LD Chip 11)

Figure 15:
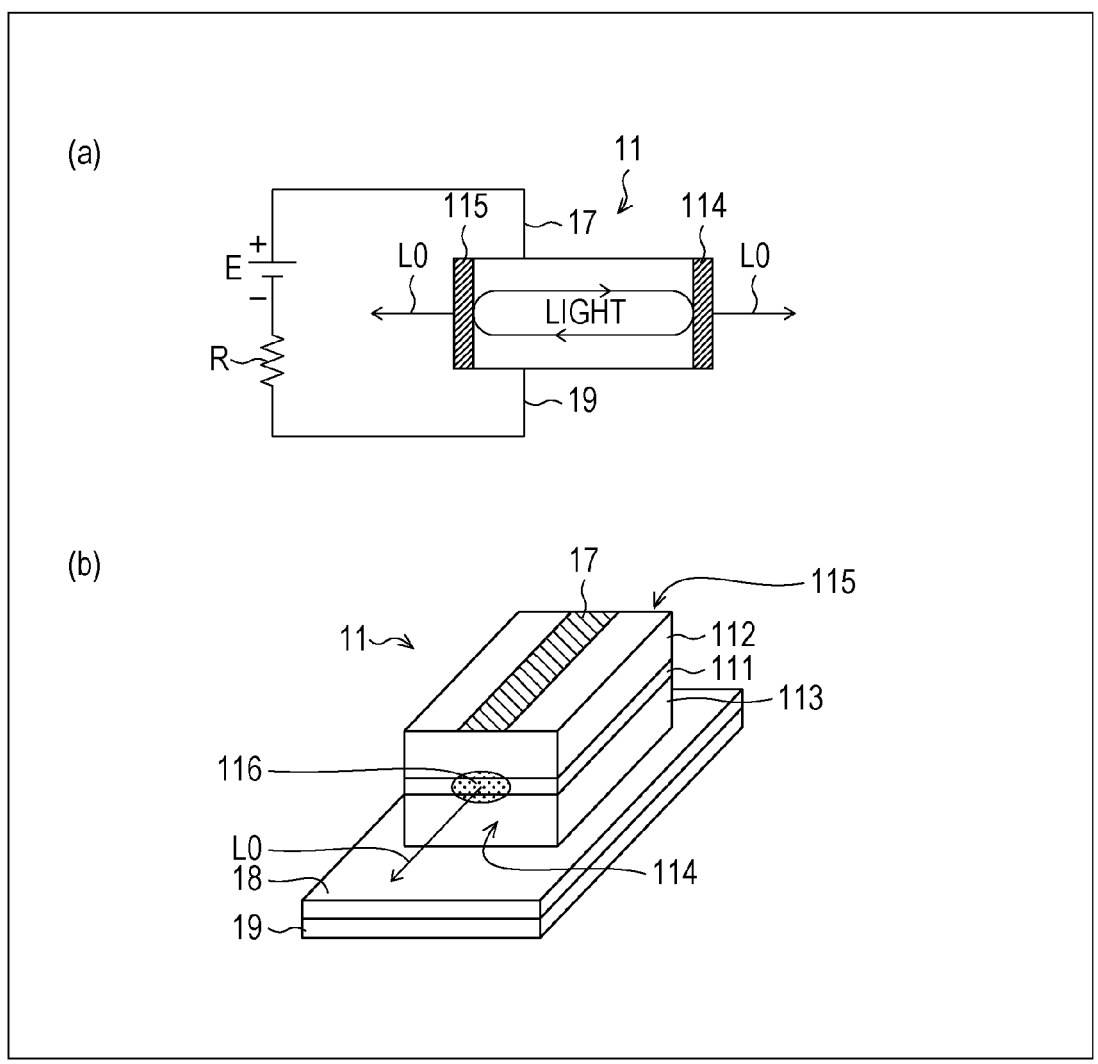
FIG. 15 is a diagram which illustrates an example of a semiconductor laser (LD) in the head lamp, in which (a) illustrates an example of a simple circuit which drives the semiconductor laser, and (b) illustrates an appearance of the semiconductor laser when viewed from the lower side slanted to the right with respect to a sheet plane.

Subsequently, more specific structure of the LD chip 11 will be described based on FIG. 15.

FIG. 15(a) illustrates an example of a simple circuit which drives the LD chip 11, and FIG. 15(b) illustrates an appearance of the LD chip 11 when viewed from the lower side slanted to the right with respect to a sheet plane.

As illustrated in the figure, the LD chip 11 has a configuration in which a cathode electrode 19, a substrate 18, a cladding layer 113, an active layer 111, a cladding layer 112, and an anode electrode 17 are laminated in this order.

The substrate 18 is a semiconductor substrate, and it is preferable that GaN, sapphire, SiC be used in order to obtain excitation light of blue to ultraviolet for exciting the fluorescent material as in the present application. In general, as the substrate for the semiconductor laser, any of materials of group IV semiconductors such as Si, Ge, and SiC, group III-V compound semiconductors which are represented by GaAs, GaP, InP, AlAs, GaN, InN, InSb, GaSb, and AlN, group II-VI compound semiconductors such as ZnTe, ZeSe, ZnS, and ZnO, an oxide insulator such as ZnO, $Al_2O_3$, $SiO_2$, $TiO_2$, $CrO_2$, and $CeO_2$, and nitride insulator such as SiN is used, in addition to those.

The anode electrode 17 is an electrode for inputting a current to the active layer 111 through the cladding layer 112.

The cathode electrode 19 is an electrode for inputting a current to the active layer 111 through the cladding layer 113 from the lower part of the substrate 18. In addition, inputting of a current is performed by applying a forward bias to the anode electrode 17 and the cathode electrode 19.

The active layer 111 has a structure of being interposed between the cladding layer 113 and the cladding layer 112.

In addition, as materials of the active layer 111 and the cladding layer, a mixed-crystal semiconductor which is formed of AlInGaN is used in order to obtain excitation light of blue to ultraviolet. In general, for the active layer and the cladding layer of the semiconductor laser, a mixed-crystal semiconductor mainly including Al, Ga, In, As, P, N, and Sb is used, and such a configuration may be used. In addition, a configuration using group II-VI compound semiconductors such as Zn, Mg, S, Se, Te, and ZnO may be also used.

In addition, the active layer 111 is a region in which light is emitted due to an input current, and due to a refractive index difference between the cladding layer 112 and the cladding layer 113, the emitted light is imprisoned in the active layer 111.

In addition, a front side cleavage surface 114 and a rear side cleavage surface 115 which are provided so as to face each other in order to imprison light which is amplified by a stimulated emission are formed in the active layer 111, and the front side cleavage surface 114 and the rear side cleavage surface 115 take roles of mirrors.

However, differently from a mirror which completely reflects light, a part of light which is amplified by the stimulated emission is emitted from the front side cleavage surface 114 and the rear side cleavage surface 115 (referred to as front side cleavage surface 114 in the embodiment for convenience) of the active layer 111, and becomes laser light L0. In addition, the active layer 111 may form a structure of a multilayer quantum well.

In addition, the rear side cleavage surface 115 which faces the front side cleavage surface 114 is formed with a reflecting film (not shown) for laser oscillating, and can cause most part of the laser light L0 to be radiated from a light emitting point 116 using the front side cleavage surface 114 as a low-reflectivity end surface by providing a difference in reflectivity between the front side cleavage surface 114 and the rear side cleavage surface 115.

When forming a film of each semiconductor layer such as the cladding layer 113, the cladding layer 112, and the active layer 111, it is possible to use a general film forming method such as a metalloraganic chemical metal vapor deposition (MOCVD) method or a molecular beam epitaxy (MBE) method, a chemical vapor deposition (CVD) method, a laser ablation method, a sputtering method. When forming a film of each metal layer, it is possible to use a general film forming method such as a vacuum evaporation method or plating, the laser ablation method, the sputtering method.

(Lens for Excitation 2)

The descriptions will be continued by returning to FIGS. 1 and 2 again. The lens for excitation 2 is a lens for adjusting a spot area (irradiated area) of the laser light L0 which is radiated to the luminous body 4. According to the lens for excitation 2, since the spot area and a position of the laser light L0 which is radiated to the luminous body 4 can be adjusted, it is possible to adjust a light emitting efficiency of the luminous body 4, and a projection property (direction of light, or distribution of intensity) of the headlight 10.

In addition, it is preferable that the spot area of the laser light L0 of the lens for excitation 2 be smaller than a surface area (light irradiated surface) on the side to which the excitation light of the luminous body 4 is radiated. Due to this, fluorescence which is emitted from the side surface (fluorescence emitted from side) which shares a side with the light irradiated surface of the luminous body 4 becomes small. Therefore, it is possible to increase a ratio of fluorescence which is emitted from the light irradiated surface of the luminous body 4 to fluorescence which is emitted from the entire surface of the luminous body 4. In addition, as a material of the lens for excitation 2, for example, quartz can be exemplified, however, it is not limited to this.

(Luminous Body 4)

The luminous body 4 generates fluorescence by being irradiated with the laser light L0 which is generated from the laser light source 1, and includes a fluorescence material which is luminous by receiving the laser light L0. Specifically, the luminous body 4 is formed by dispersing a fluorescence material in a sealing material, by hardening the fluorescence material, or by fixing the fluorescence material on a substrate such as metal. According to the embodiment, the luminous body 4 is assumed to be a body in which the fluorescence material is sealed with a transparent sealing material, and the sealed fluorescence material is fixed on a base 5$h$ as is.

The luminous body 4 is also referred to as a so-called wavelength conversion element for converting the laser light L0 into fluorescence, and according to the embodiment, the luminous body 4 is arranged at approximately a focal point position of the half parabolic mirror 5P.

According to the embodiment, the luminous body 4 has a column shape (disk shape) of which a diameter in a base circle is 2 mm, however, the size and shape thereof are not limited to these, and it is possible to select arbitrary sizes and various shapes. As a shape excluding the disk shape, a prismatic shape, an oval pillar shape, or the like can be exemplified.

In addition, the thickness of the luminous body 4 at a portion of the fluorescent material in the irradiation direction of the laser light L0 is 1 mm according to the embodiment, however it is preferable that the thickness be 0.015 mm or more and 1.5 mm or less. When the thickness of the luminous body 4 at the portion of the fluorescent material exceeds 1.5 mm, a path length of transmitted light which penetrates the luminous body 4 becomes too long, and a generation efficiency of fluorescence in the luminous body 4 decreases. On the other hand, when the thickness of the luminous body 4 at the portion of the fluorescent material is less than 0.015 mm, an intensity of fluorescence which is generated from the luminous body 4 becomes too weak. However, if it is possible to obtain a desired luminous (fluorescent) amount, a thickness out of the above described range of the numerical values can be adopted.

Subsequently, as the fluorescent material included in the luminous body 4, for example, it is possible to use an oxynitride-based fluorescent material (for example, sialon fluorescent material), or group III-V compound semiconductors fluorescent nanoparticles (for example, indium phosphorus: InP). These fluorescent materials have high heat resistance with respect to the laser light L0 with high output (and/or optical density) which are emitted from the LD chip 11, and are able to suppress a deterioration of the luminous body 4. However, the fluorescent material of the luminous body 4 is not limited to the above, and may be another fluorescent material excluding that such as a nitride-based fluorescent material.

In addition, the illumination light L1 of the head lamp 10 is regulated to be a white color having chromaticity in a predetermined range by the law or the like, depending on countries or regions. For this reason, a fluorescent material which is selected so as to make the illumination light L1 the white color is included in the luminous body 4.

For example, when a fluorescent material of blue, green, and red colors is included in the luminous body 4, and is irradiated with the laser light L0 of 405 nm, then white light is generated.

In addition, when the color of the illumination light L1 is not regulated by the law or the like, or there is a separate regulation of chromaticity, for a selection of the luminous body 4, the white color of the illumination light L1 is not specified as described above.

The sealing material of the luminous body 4 is, for example, a glass material (non-organic glass, organic-inorganic hybrid glass), or a resin material such as silicone resin. As the glass material, low melting point glass may be used. As the sealing material, it is preferable to use a material with high transparency, and to use a material with high heat resistance when the laser light has a high output.

(Half Parabolic Mirror 5P)

The half parabolic mirror 5P reflects fluorescence which is generated by the luminous body 4, and forms a bundle of light rays (illumination light L1) which proceeds in a predetermined solid angle. The half parabolic mirror 5P, for example, may be a member in which a metal thin film is formed on the surface, may be a metal member, or may be a glass member which is transparent at least with respect to a wavelength of fluorescence, or a member with a structure in which the inside is covered with synthetic resins.

The half parabolic mirror 5P is formed by a partially curved surface (half parabolic) which is obtained by cutting rotating paraboloid on a plane including a rotation axis thereof.

A part of the half parabolic mirror 5P in such a shape is arranged on the upper part of a top face (light irradiated surface) of the luminous body 4 which has a wider area than the side surface. That is, the half parabolic mirror 5P is arranged at a position at which the top face of the luminous body 4 is covered. When being explained in another point of view, a part of the side surface of the luminous body 4 faces a direction of an opening portion of the half parabolic mirror 5P (right side with respect to sheet plane).

By setting a positional relationship between the luminous body 4 and the half parabolic mirror 5P as described above, it is possible to make fluorescence of the luminous body 4 be efficiently projected in a solid angle, and to increase a use efficiency of the fluorescence.

In addition, according to the above described configuration, the half parabolic mirror 5P includes a half parabola (light reflecting concave surface SUF 3) which is obtained by cutting a parabola on a plane including a rotation axis, and it is possible to arrange a structure body excluding the parabola at a portion corresponding to a remaining half of the parabola. When the structure body is set to a base 5h with a high thermal conductivity which will be described later, and the luminous body 4 is caused to come into contact therewith, it is possible to efficiently cool down the luminous body 4.

In addition, in the above described configuration, most of fluorescence which cannot be controlled in the half parabolic mirror 5P is emitted to the parabola side. It is possible to illuminate a wide range on the parabola side of the head lamp 10 using the property.

In addition, the laser light source 1 is arranged outside the half parabolic mirror 5P, and the half parabolic mirror 5P is formed with a window portion 3 which transmits the laser light L0, or makes the laser light pass therethrough. According to the embodiment, the window portion 3 is the opening portion (hole), however, it is not limited to this, and a transparent member which can transmit the laser light L0 may be included. For example, a transparent plate in which a filter for transmitting the laser light L0, and reflecting a fluorescent component of the luminous body 4 is installed may be provided as the window portion 3. It is possible to prevent the fluorescence of the luminous body 4 from being leaked from the window portion 3 using the configuration.

In addition, a portion which is not parabolic may be included at a part of the half parabolic mirror 5P. In addition, the reflecting mirror of the head lamp 10 according to the embodiment may be a half parabolic mirror having an opening portion in a closed semicircular shape, or a mirror including a part thereof. In addition, the above described reflecting mirror is not limited to a half parabolic mirror, and it is possible to adopt an arbitrary shape when a desired light amount or an intensity distribution can be obtained as illumination. Naturally, it is more preferable that the reflecting mirror be a mirror in which at least a part of a curved surface which is formed by rotating a figure (oval, circle, or parabola) about a rotation axis is included on the reflecting surface thereof, as a half ellipsoid mirror, or a half spherical surface mirror, when considering condensing or distribution of light (distribution of light intensity).

(Base 5h)

According to the embodiment, the luminous body 4 is supported by the base 5h, and the base 5h is assumed to reflect a part of the laser light L0 which penetrates the inside of the luminous body 4.

In this manner, a part of the laser light L0 penetrates the luminous body 4, and the transmitted light is turned back (reflected) on the base 5h.

In addition, the base 5h is mainly formed of metal (for example, copper or iron). Therefore, the base 5h has high thermal conductivity, and can efficiently radiate heat of the luminous body 4. In addition, the base 5h may be a member including a material with high thermal conductivity (quartz, sapphire, or the like), in addition to metal without being limited to a metal material. However, it is preferable that the surface of the base 5h which comes into contact with the luminous body 4 function as a reflecting surface when the luminous body 4 does not have a reflective substrate such as metal.

Since the surface is a reflecting surface, it is possible to make the laser light L0 which is input from the top face of the luminous body 4 go toward the half parabolic mirror 5P by being reflected on the reflecting surface, after being converted into fluorescence. Alternatively, it is possible to convert the laser light L0 which is input from the top face of the luminous body 4 into fluorescence by causing the laser light to be reflected on the reflecting surface, and causing the laser light to go toward the inside of the luminous body 4 again.

Since the base 5h is covered with the half parabolic mirror 5P, the base 5h has a surface facing the light reflecting concave surface SUF 3 of the half parabolic mirror 5P. It is preferable that the surface of the base 5h on a side on which the luminous body 4 is provided be generally parallel to the rotation axis of the rotating parabola of the half parabolic mirror 5P, and generally include the rotation axis.

In addition, reflectivity of light at a portion which does not come into contact with the luminous body 4 of the base 5h may be set to be high when the fluorescence component from the luminous body 4 is radiated to the outside by being reflected again, and in contrast to this, the reflectivity is set to be low when the fluorescence component which is reflected again causes unnecessary light intensity distribution. In order to make the reflectivity high, the surface of the base 5h is subject to mirror polishing, or depositing of a metal film or the like is taken into consideration, and in order to make the reflectivity low, painting in black, surface roughening, or the like is taken into consideration. Alternatively, surface processing such as selectively absorbing the laser light L0 which is reflected in an unnecessary direction may be performed.

(Laser Cut Filter 6)

The laser cut filter 6 is a transparent resin plate which covers the opening portion of the half parabolic mirror 5P. It is preferable that the laser cut filter 6 cut off a coherent component included in the laser light L0 which comes from the laser light source 1, and be formed of a material which transmits the coherent component included in the laser light and white light which is generated when converting the laser light L0 in the luminous body 4.

The laser cut filter 6 absorbs or reflects light with a wavelength which is shorter than 410 nm, and prevents the laser light from being leaked to the outside of a device, when it is assumed that, for example, the wavelength of light which is emitted from the laser light source 1 is 410 nm. In addition, the wavelength of light which is cut by the laser cut filter 6 may be determined in consideration of a hue of visible light, the wavelength of the laser light L0, and a light amount.

In addition, it is possible to prevent humidity, dust, or the like in an external environment from getting in by sealing the half parabolic mirror 5P and the base 5h therebetween using the laser cut filter 6.

(Projection Lens 8)

The projection lens 8 (front surface plastic cover) is provided on the opening portion side of the half parabolic mirror 5P (right side with respect to sheet plane). A material which forms the projection lens 8 in the embodiment is plastic, however, it is not limited to this. For example, a transparent resin material, quartz, or the like may be used excluding that.

The fluorescence which is generated in the luminous body 4, or the fluorescence which is reflected by the half parabolic mirror 5P is projected to the outside of the half parabolic mirror 5P through the projection lens 8.

According to the embodiment, the projection lens 8 has a convex lens shape, and has a structure including a lens function, however, the shape is not limited to the convex lens, and may also have a concave lens shape. In addition, the projection lens 8 does not necessarily have the structure including the lens function, and may have at least translucency transmitting fluorescence which penetrates the laser cut filter 6. That is, the projection lens 8 may be formed of any materials when having at least the translucency.

It is preferable that the thickness of the projection lens 8 be approximately 3.0 mm or less. This is because when the thickness exceeds 3.0 mm, it is not possible to neglect absorbing of the fluorescence, and the material cost increases. However, naturally, it is also possible to make the thickness be thicker than 3.0 mm in order to lower a possibility of a damage due to a flying stone, in consideration of the absorbance of fluorescence, or the cost.

In addition, it is preferable to cover the surface of the projection lens 8 with a filter (film) which cuts off the laser light L0 of the laser light source 1, and transmits the fluorescence which is generated from the luminous body 4, or the fluorescence which is reflected on the light reflecting concave surface SUF 3.

The coherent laser light L0 which penetrates the luminous body 4 is cut off in the above described laser cut filter 6. However, a case in which a gap occurs between the laser cut filter 6 and the opening portion of the half parabolic mirror 5P for some reasons, and the laser light L0 is leaked from the gap, or a case in which a part of the laser light L0 is leaked due to a wavelength fluctuation in light emission of the laser light source 1, and a fluctuation in a cutoff property of the laser cut filter 6 caused by a temperature, or a deterioration due to time is taken into consideration. Even in such a case, it is possible to prevent the laser light L0 from leaking to the outside by cutting off of the laser light L0 using the filter.

(Wiring 9)

The wiring 9 is wiring for supplying a current to the laser light source. FIG. 1 schematically illustrates a routing state of the wiring 9 in the head lamp 10.

As illustrated in FIG. 1, in the routing of the wiring 9, wiring on the positive side (portion of solid line) is directly connected to the laser light source 1. On the other hand, wiring on the negative side (portion of one-dotted dashed line, wiring on reference potential side) in the routing of the wiring 9, that is, a part of the wiring 9 (security wire) is provided at a portion at which a breakage easily occurs due to at least one transformation (damage) of the laser light source 1, the lens for excitation 2, the luminous body 4, the laser cut filter 6, the half parabolic mirror 5P, and the base 5h, or due to a change in the installation position (position deviation).

In addition, as in the above described configuration, if a part of the wiring 9 is a part of wiring on the reference potential side (negative side), a part of the wiring 9 is connected to the GND side (side of which potential is close to ground potential of vehicle (body), or side of which potential is the same as the ground potential) in a direct current manner. For this reason, even when a surge (or noise) occurs at a part of the wiring 9 for some reasons, or another electric-equipment system having a different potential approaches, or makes a contact (fault contact), there is a high possibility that a potential difference between both the electrodes of the laser light source 1 may not become so large, or may be in a level which can be neglected in practice. For this reason, due to the surge, it is possible to reduce a possibility of breaking the laser light source 1.

In addition, as a case in which a part of the wiring 9 and another electric-equipment system having a different potential approach, and make a contact, a case is assumed in which a part of the wiring 9 and a surge potential (ground potential of vehicle (body)) make a fault contact. In addition, in a normal use state, the ground potential of the vehicle is considered to be approximately the same as the reference potential of the head lamp 10.

In addition, if a part of the wiring 9 is a part of wiring on the reference potential side, even when another high voltage electric-equipment system approaches a part of the wiring 9, and an electric discharge or the like occurs, since a part thereof is on the reference potential side of the wiring 9 as the discharge target, it is possible to reduce a possibility that the laser light source 1 may be broken due to a shock which is caused by the discharge or the like.

Subsequently, the above described lens for excitation 2, the luminous body 4, the laser cut filter 6, the half parabolic mirror 5P, and the base 5h are representative example of "optical members", respectively.

The "optical member" is a member which changes a state of the laser light L0 which is emitted from the laser light source 1. As such an optical member, there is a prism, a lens, a wavelength conversion element, an optical filter, a diffraction grating, a polarizing plate, an optical path change member, or the like. The "lens" is a member which adjusts a spot diameter of laser light, and the lens for excitation 2 is a representative example. The "wavelength conversion element" is a member which converts the laser light into light with a different wavelength, and the luminous body 4 or a fluorescent material which will be described later is a representative example, however, the wavelength conversion element is not limited to this, and may be the above described second harmonic generation element, for example. The "optical filter" is a member which cuts off light with a wavelength in a predetermined wavelength range, and transmits light with a wavelength other than that. For example, the laser cut filter 6 which will be described later, and the above described filter (film) are representative examples. The "optical path change member" is a member which changes an optical path of laser light L0, and the half parabolic mirror 5P and the base 5h are representative examples.

Here, for example, a case in which the head lamp 10 meets with an intentional or an unforeseen accident will be taken into consideration. At this time, there is a possibility that at least one of the laser light source 1 and the optical member may be deformed, or the installation position may be changed due to the accident. For this reason, there is a possibility that laser light L0 may be leaked to the outside of a device when an optical path of the laser light L0 which is generated from the laser light source 1 is changed, or the laser cut filter 6 is not able to cut off the laser light L0.

Therefore, in the head lamp 10, routing of the wiring 9 is performed as illustrated in FIG. 1. In addition, even when at least one of the laser light source 1 and the optical member is deformed, or the installation position is changed, conversely, an arrangement of a part of wiring 9 may not be performed at a portion in which there are no concerns about leaking of the laser light L0, or which has a bare chance of leaking.

Due to this, when at least one of the laser light source 1 and the optical member is deformed, or the installation position is changed, there is a high possibility that a part of the wiring 9 may be broken. In addition, when a part of the wiring 9 is broken, supplying of a current to the laser light source 1 is instantly cut off. Accordingly, it is possible to make a time lag which occurs between an accident occurrence and cutoff of energization of a semiconductor laser substantially zero compared to the technologies which are disclosed in PTLs 1 to 5.

(Regarding Routing of Wiring 9)

Subsequently, routing of the wiring 9 will be described in detail based on FIG. 2. FIG. 2 is a diagram which illustrates an example of routing of the wiring 9 in the head lamp 10.

Figure 2:
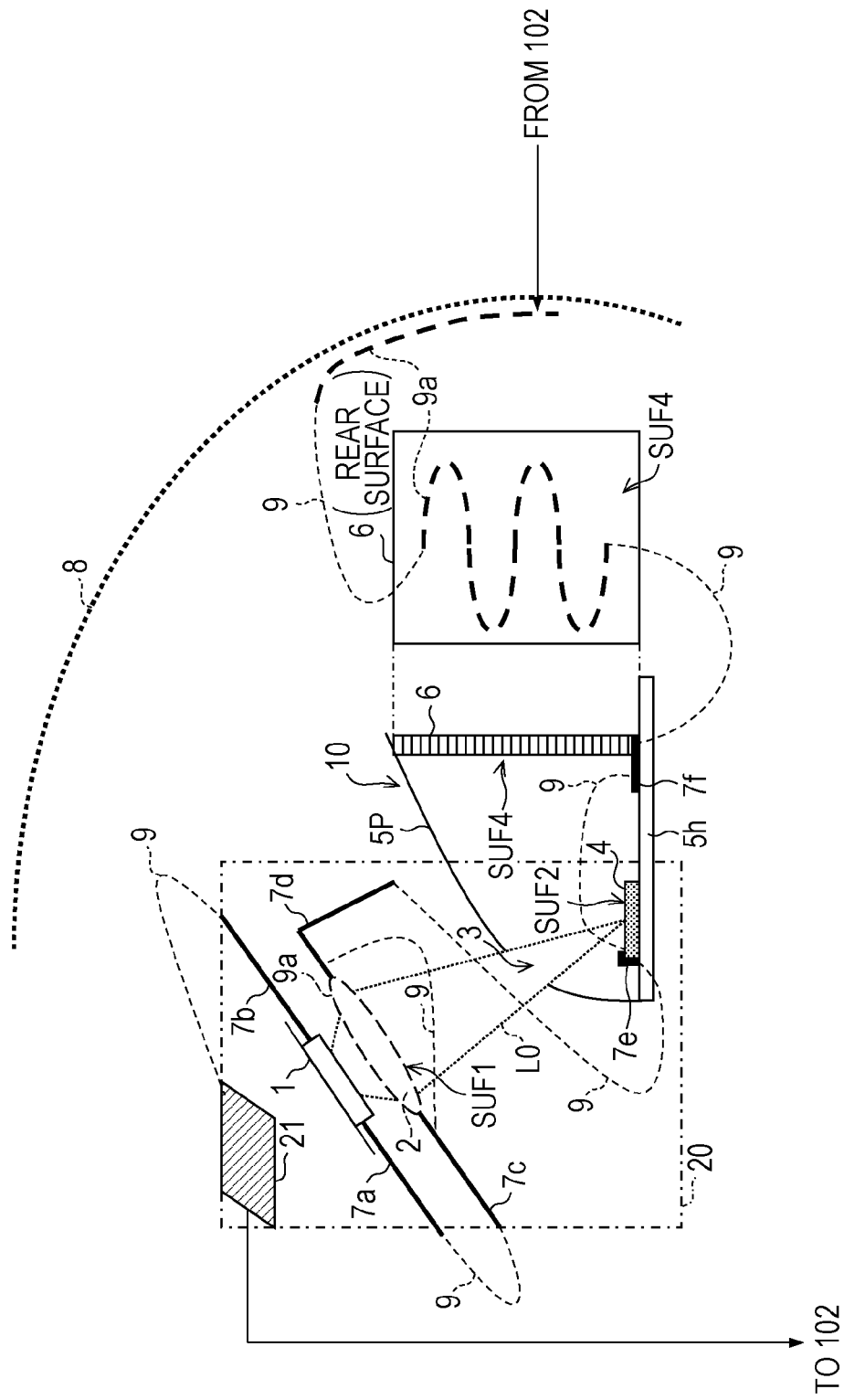
FIG. 2 is a diagram which illustrates an example of routing of wiring in the head lamp.

In the example which is illustrated in FIG. 2, the laser light source 1 and the lens for excitation 2 (portion treating high output laser light L0) are accommodated in a sealing housing 20 which is configured of a material which does not let light go through. In addition, a seal (wiring) 21 is provided so as to cause a breakage when the sealing housing 20 is broken or open, and forms a part of the wiring.

In addition, the laser light source 1 is supported by fixing members 7a and 7b which are bonded in the sealing housing 20. The lens for excitation 2 is supported by fixing members 7c and 7d which are bonded in the sealing housing 20. The luminous body 4 is fixed by a fixing member 7e onto the base 5h. In addition, the laser cut filter 6 is fixed by a fixing member 7f onto the base 5h.

Subsequently, as installation methods of a part of the wiring 9, (1) a case in which a part of the wiring 9 is installed on the surface of at least one of the laser light source 1 and the optical member, or a vicinity thereof, and (2) a case in which a part of the wiring 9 is installed on the surface of the fixing members 7a to 7f for fixing at least one of the laser light source 1 and the optical member, or a vicinity thereof, or the like can be exemplified.

However, the installation methods of a part of the wiring 9 are not limited to these. That is, a part of the wiring 9 may be installed at a portion in which there is a possibility of dangerousness which is caused by the laser light due to occurring of an accident.

In addition, it is preferable that a part of the wiring 9 have a structure in which a breakage easily occurs. Due to this, it is possible to make a possibility of breaking of a part of the wiring 9 higher when at least one of the laser light source 1 and the optical member is deformed, or the installation position is changed.

As the "structure in which breakage easily occurs", for example, there is a case in which a part of the wiring 9 is made a connection portion of a conductor which is formed of a different material, a case in which the thickness of a part of the wiring 9 is made thinner than other portions, or a case in which a part of the wiring 9 is formed in a shape in which the wiring is easily broken.

A translucent conductive film such as an indium tin oxide (ITO) film is provided on the surface of the laser light source 1, the lens for excitation 2, the luminous body 4, the laser cut filter 6, and the projection lens 8, and is set to be a part of the wiring 9. In addition, FIGS. 1 and 2 illustrate an example of a portion in which a conductive film formation unit (wiring) 9a such as the ITO film is provided in the head lamp 10, however, the portion for providing the conductive film formation unit 9a is not limited to the example.

In addition, when providing the conductive film formation unit 9a in the laser cut filter 6, it is preferable to select the inner surface SUF 4 which is close to the luminous body 4, rather than the outer surface which is easily exposed to atmosphere, since it is hard for the SUF 4 to be influenced by atmospheric corrosive gas. However, when the conductive film formation unit 9a is configured of a material which deteriorates extremely due to the laser light L0, the conductive film formation unit can be provided at the outer surface.

In addition, when an optical element and the fixing member are fixed using an adhesive, a part of the wiring 9 may be embedded in the adhesive. In addition, metallic foil may be attached between the optical element and the fixing member. In addition, a part of the wiring 9 may be formed of a thin conductor line, or the metallic foil may be put around.

In addition, in any of the above described cases, it is preferable to have a shape which is easily broken when at least one of the laser light source 1 and the optical member is deformed (damaged) due to an accident or the like, or the installation position is changed (displaced).

By appropriately combining the above described routing method of a part of the wiring 9, it is possible to substantially reliably break a part of the wiring 9 at the time of an accident. Accordingly, it is possible to prevent the laser light L0 from leaking to the outside at the time of an accident or the like, since the energization of the laser light source 1 is instantly cut off.

In addition, in the light emitting device which is disclosed in PTL 3, a pressure sensor, or a temperature sensor is used in order to detect flowing in of ambient air, and these sensors are special and expensive, however, when adopting the head lamp 10 according to the embodiment, it becomes simple and cheap only by devising the installation position of a part of wiring.

In addition, in an airbag linking technology which is disclosed in the previous application, if an airbag sensor is not attached in front of a headlight, it is dangerous since a stop of laser light is delayed when an accident occurs, and accordingly, the headlight cannot be independently designed as a unit, and a degree of freedom in design decreases. In addition, when using only an acceleration sensor in a technology which is disclosed in the previous application, a probability of destruction detection of a flying object (flying stone, or the like) which breaks through a transparent window (corresponding to projection lens 8) on the emitting surface at high speed is lowered.

According to the head lamp 10 in the embodiment, along with the position deviation, or the damage of the optical member, it is possible to make the laser light stop instantly, and to solve these problems. In addition, for example, it is possible to reliably prevent energization of the laser light source 1 regardless of operations of other elements even at a non-energizing time period when an abnormality such as the position deviation, the damage, or the like of the optical member occurs, compared to a case in which turning on and off of a laser light source is determined after recognizing a state of wiring or an optical member using a micro processor, or the like, and accordingly, it is possible to obtain a high certainty and reliability when preventing emitting of the laser light to the outside of a device.

In addition, in the previous application, in order to detect a dangerousness of leaking of laser light to the outside, light receiving elements are provided at a plurality of portions by being divided, and abnormality of reflected light from a member onto which a fluorescent material is applied is detected based on a light receiving state of the light receiving elements. For this reason, it is difficult to make a time lag which occurs between an accident occurrence and cutoff of energization of the semiconductor laser zero, or an instant which can be substantially neglected, as in the head lamp 10 according to the embodiment.

In addition, in the literature, as described above, a collision detection unit is provided, and turning off of an illumination body, and prevention of leaking of laser is attempted in cooperation with an airbag, or the like, however, in the head lamp 10 according to the embodiment, energization of the laser light source is physically cut off at an instant when an abnormality occurs (occurring of breakage), the special structure in the literature is not necessary.

In addition, in the technology in PTL 3, there also is a significant time lag between an accident occurrence and cutoff of energization of the semiconductor laser due to a change in a pressure or a temperature, or a time which is taken in the significant change in a unit of ms.

(Another Example of Routing of Wiring 9)

Figure 14:
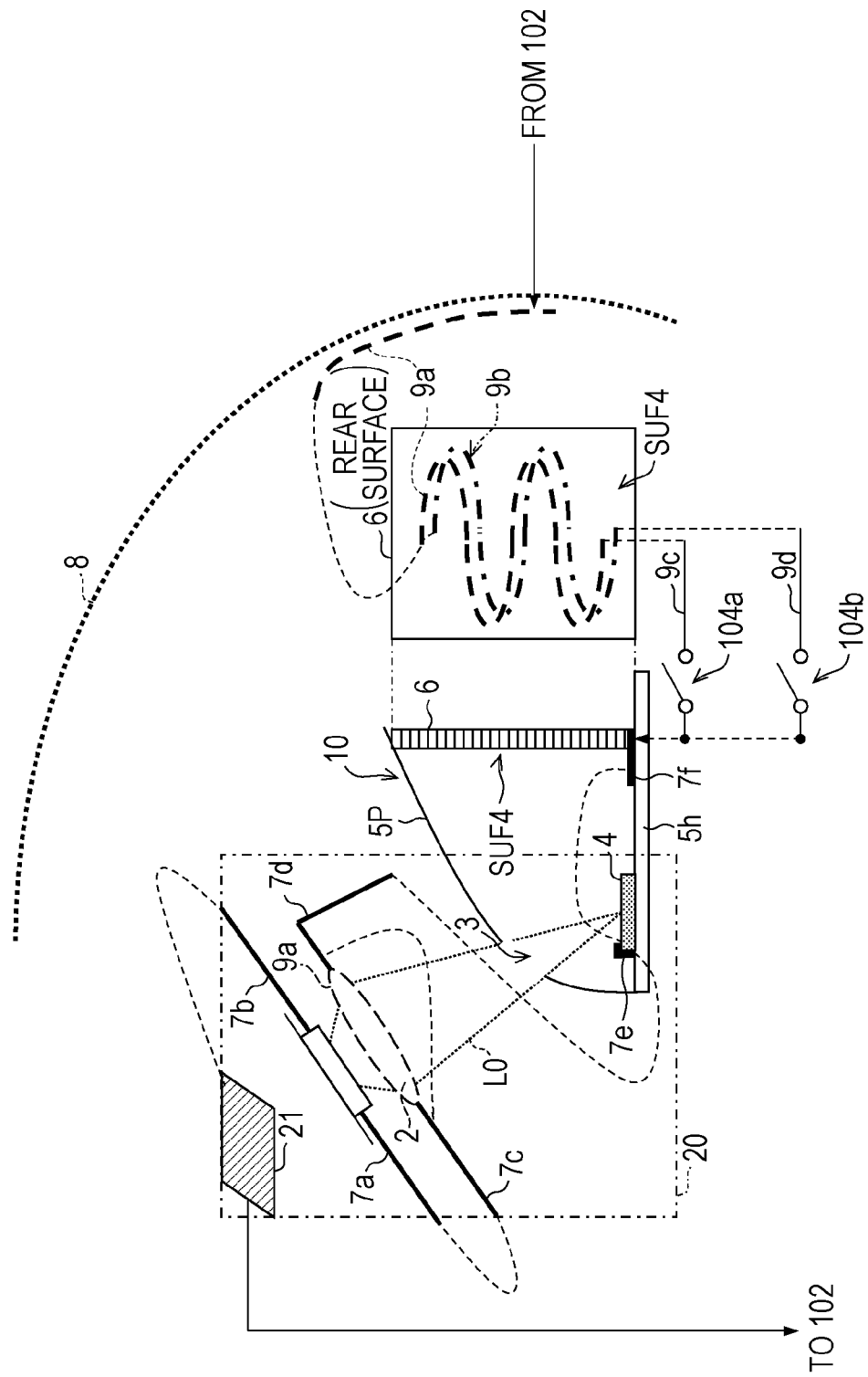
FIG. 14 is a diagram which illustrates another example of the routing of wiring in the head lamp.

Subsequently, another example of routing of the wiring 9 in the head lamp 10 will be described based on FIG. 14. FIG. 14 is a diagram which illustrates another example of the routing of the wiring 9.

Differences in the routing of the wiring 9 in FIG. 14 from the routing of the wiring 9 in FIG. 2 are that, (1) there are two paths of an energizing path (wiring) 9c, and an energizing path (wiring) 9d in energizing paths to the laser light source 1, and (2) the energizing path 9d is connected to a heat generating conductor 9b.

In addition, according to the embodiment, the energizing paths to the laser light source 1 are set to two, however, three or more energizing paths may be provided.

(Energizing Path 9c)

An energizing path 9c is the same energizing path as that in FIG. 2 which is described above, and is connected to the conductive film formation unit 9a. In addition, energizing and non-energizing of the energizing path 9c is switched by an energizing path switching switch 104a.

(Heat Generating Conductor 9b)

Subsequently, the heat generating conductor 9b is a conductor which generates heat when a current flows in, and according to the embodiment, and a thin nichrome wire is adopted thereto. However, a constituent material of the heat generating conductor 9b is not limited to the nichrome wire.

In addition, when providing the heat generating conductor 9b in the laser cut filter 6, it is preferable to select the inner surface SUF 4 which is close to the luminous body 4, rather than the outer surface which is easily exposed to atmosphere, since it is hard for the SUF 4 to be influenced by atmospheric corrosive gas. However, when the heat generating conductor 9b is configured of a material which extremely deteriorates due to the laser light L0, the heat generating conductor can be provided at the outer surface.

(Energizing Path 9d)

The energizing path 9d is connected to the heat generating conductor 9b. In addition, energizing and non-energizing of the energizing path 9d is switched by an energizing path switching switch 104b.

In this manner, when defogging is necessary, switching to the energizing path 9d is performed, and when the defogging is not necessary, switching to the energizing path 9c is performed, whereby, it is possible to make the energizing path serve both as an anti-fog heater and a current path. In addition, it is possible to reduce the number of components by causing the energizing path to also serve as the anti-fog heater, by switching both in terms of time.

(Laser Driving Circuit 100)

Subsequently, a schematic configuration of a laser driving circuit 100 in the head lamp 10 will be described based on FIG. 3. First, FIG. 3 is a block diagram which illustrates an example of the laser driving circuit 100. As illustrated in the figure, the laser driving circuit 100 includes a laser control unit 101, a laser driving unit 102, and an output switching element 103.

In addition, the laser control unit 101 receives a signal S0 from an illumination control unit 30 which is provided outside, and returns a signal S4 to the illumination control unit 30. The signal S0 is a command signal which commands ON and OFF of the laser light source 1, or a command signal which commands respective magnitudes of a driving voltage and a driving current of the laser light source 1. The signal S4 is a report signal which reports an ON state of the laser light source 1, or a state including an abnormality such as a failure, or the like.

Subsequently, the laser driving unit 102 receives a signal S1 from the laser control unit 101, and returns a signal S3 to the laser control unit 101.

The signal S1 is a control signal for controlling ON and OFF of the laser light source 1, and a control signal for instructing respective magnitudes of a driving voltage and a driving current. In addition, the signal S3 is a state report signal which reports a state of the laser driving unit 102, the driving current of the laser light source 1, and the driving voltage of the laser light source 1.

The laser driving unit 102 receives the signal S1 from the laser control unit 101, and supplies a power from a power source E (battery) to the laser light source 1 as the driving voltage and the driving current.

The laser light source 1 is turned on using the driving voltage and the driving current which are supplied from the laser driving circuit 100.

In addition, whether or not providing an output switching element 103 is arbitrary, however, as will be described later, the laser driving unit 102 includes a capacitor such as a capacitor 1023 in many cases in case of detecting a collision acceleration using a not shown acceleration sensor, a case of detecting an abnormality of the laser driving unit 102, or the like, it is desirable to provide the output switching element in order to shorten an OFF time of the laser light source 1. In addition, a control of the output switching element 103 is performed by at least one of the laser control unit 101 and the laser driving unit 102. In addition, the signal S2 is a control signal for controlling ON and OFF of the output switching element 103.

In addition, the laser driving unit 102 is configured according to a connection form of a plurality of LD chips 11 in the laser light source 1.

(Laser Driving Unit 102)

Subsequently, examples 1 to 10 of the laser driving unit 102 will be described based on FIGS. 4 to 13. In addition, all of the laser driving units 102 according to the examples 1 to 10 which will be described later can be applied to the laser driving circuit 100 which is illustrated in FIG. 3. Descriptions of configurations, excepting for the configuration which will be described in the following specific examples, are omitted in some cases, as necessary, however, when being described in another example, the configurations are the same as those in the example. In addition, for easy description, members having the same functions as the members which are illustrated in each example will be given the same reference numerals, and descriptions thereof will be appropriately omitted.

EXAMPLE 1

Figure 4:
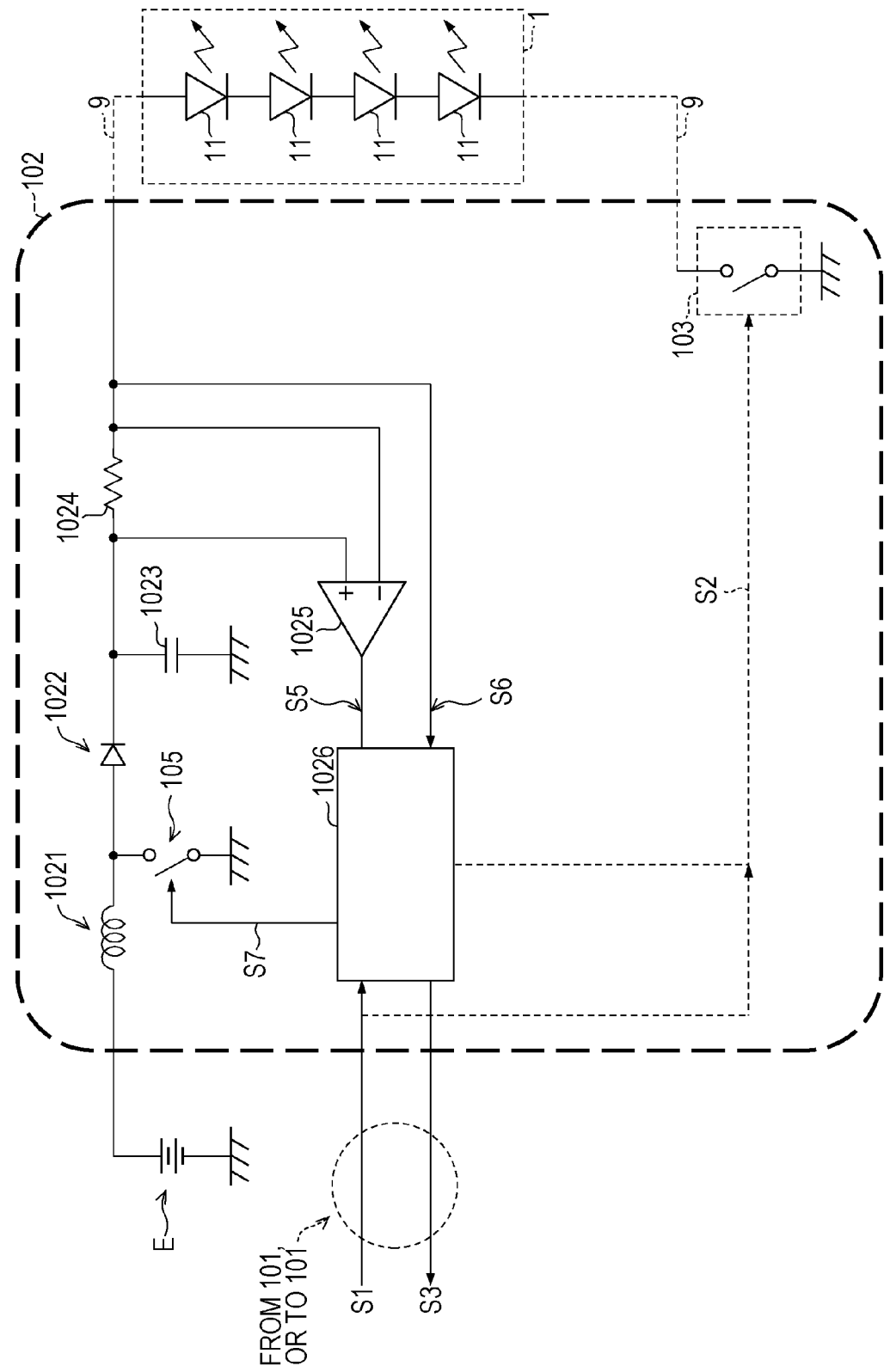
FIG. 4 is a block diagram which illustrates an example of a laser driving unit (step-up type) in the laser driving circuit.

FIG. 4 is a block diagram which illustrates a circuit configuration of the laser driving unit 102 (step-up type) in Example 1. It is an example of a step up circuit which is used when a voltage necessary for driving of the laser light source 1 is higher than a voltage of the power source E. In addition, the laser driving unit 102 in the Example 1 is used when a laser light source 1 includes a plurality of LD chips 11, and slightly more LD chips (number of 3 and 4 in series or more) are connected in series.

As illustrated in FIG. 4, the laser driving unit includes a main switching element 105, a coil 1021, a diode 1022, a current detecting resistor 1024, a differential amplifier 1025, a switching control unit 1026, and the above described output switching element 103. In addition, an end of the coil 1021 is connected to the power source E. In addition, a separate switching element may be provided between the power source E and the coil 1021.

In addition, the laser driving unit 102 in the Example 1 is connected to a laser light source 1 including four LD chips 11 in total.

The switching control unit 1026 receives a signal S1 which comes from the laser control unit 101, and returns a signal S3 to the laser driving unit 102. The same is applied to the signals S1 and S3. In addition, the switching control unit 1026 switches ON and OFF of the main switching element 105, when receiving the signal S1, so that a (desired) current which is instructed in the laser light source 1 flows.

During the ON period of the main switching element 105, a current from the power source E is accumulated as a magnetic flux energy through the coil 1021, and is accumulated in a capacitor C as a charge. A current is supplied to the laser light source 1 from a capacitor 1023 in the mean time.

On the other hand, during the OFF period of the main switching element 105, the magnetic flux energy of the coil 1021 becomes a current, the current charges the capacitor 1023 via the diode 1022 by being in series with the voltage of the power source E, and the current is supplied to the laser light source 1, as well.

The current which is supplied to the laser light source 1 is detected by the current detecting resistor 1024 and the differential amplifier 1025, and turns ON/OFF the main switching element 105 so as to maintain a driving current value which is instructed by the laser control unit 101.

In addition, in FIG. 4, a signal S5 is an output current signal, a signal S6 is an output voltage signal, and a signal S7 is a control signal for controlling switching of ON/OFF of the main switching element 105.

In the above described configuration, since the coil 1021 and the capacitor 1023 which accumulate energy are present, energization of the laser light source 1 is not instantly cut off even when the switching control unit 1026 turns off the main switching element 105. For this reason, a configuration in which a current is forcibly (at high speed) cut off in the output switching element 103 may be possible. However, naturally, it is possible to instantly and reliably cut off a current supplied to the laser light source 1, regardless of operations in other elements using a breakage of a part of wiring 9 (security wire) with respect to a deviation or a damage of an optical member.

In addition, in the laser driving unit 102 in Example 1, a portion which is denoted by a dashed line in the wiring 9 is used as a security wire. That is, the portion is guided to the laser light source 1, the lens for excitation 2, the luminous body 4, the half parabolic mirror 5P, the base 5h, the laser cut filter 6, the fixing members 7a to 7f, the surface, or the vicinity of the sealing housing 20, and a seal 21.

In this manner, when somewhere in the portion of the dashed lien in the wiring 9 is broken, the energization of the laser light source 1 is instantly cut off, and the security is secured.

EXAMPLE 2

Figure 5:
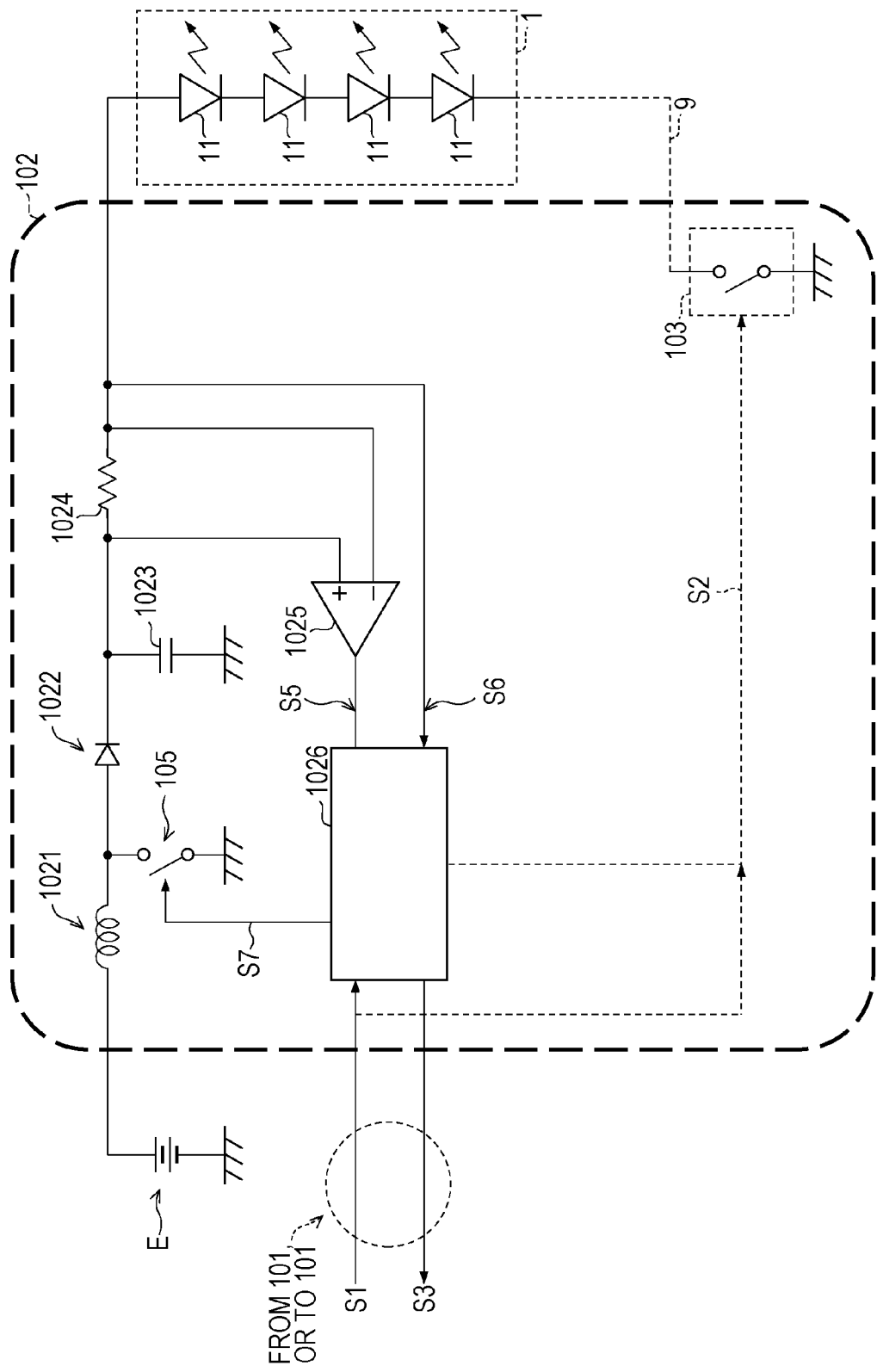
FIG. 5 is a block diagram which illustrates another example of the laser driving unit (step-up type) in the laser driving circuit.

Subsequently, FIG. 5 is a block diagram which illustrates a circuit configuration of a laser driving unit 102 in Example 2 (step-up type).

A difference in the laser driving unit 102 in Example 2 from that in Example 1 is that a part of wiring 9 (security wire) which is guided to a laser light source 1, a lens for excitation 2, a luminous body 4, a half parabolic mirror 5P, a metal base 5h, a laser cut filter 6, fixing members 7a to 7f, the surface, or the vicinity of a sealing housing 20, and a seal 21 is a portion which is denoted by a dashed line (wiring on reference potential side).

Accordingly, even if a part of the wiring 9 comes into a fault contact with another electric-equipment system, it is possible to prevent a damage of the laser light source 1, since an excessive current or voltage in the forward direction or reverse direction is not applied to the laser light source 1.

In addition, when routing of the wiring 9 is long, there is a case in which a negative surge (voltage) occurs on the GND side (reference potential side) of the laser light source 1 due to a parasitic inductance pa1 which is proportional to the length of the wiring 9, when the laser driving unit 102 tries to turn off a driving current, in particular. In order to prevent this, it is preferable to turn off an output switching element 103 after mildly stopping a current of the laser light source 1, by stopping switching in a switching control unit 1026, first, at an OFF time of the laser light source 1, and to start an operation of the switching control unit 1026 after turning on the output switching element 103 in advance at an ON time of the laser light source 1.

As a matter of course, when the laser light source 1 is turned off in an emergency such as an accident, it is desirable that the output switching element 103 is turned off before stopping the laser driving unit 102 in the context of preventing leaking of laser light.

In addition, also in the Example, it is needless to say that instant and reliable cutting off of a current which flows into the laser light source 1 is possible with respect to a deviation or damage of the optical member due to the above described accident, or the like, regardless of the operation of the output switching element 103 in a part of the wiring 9 (security wire).

EXAMPLE 3

Figure 6:
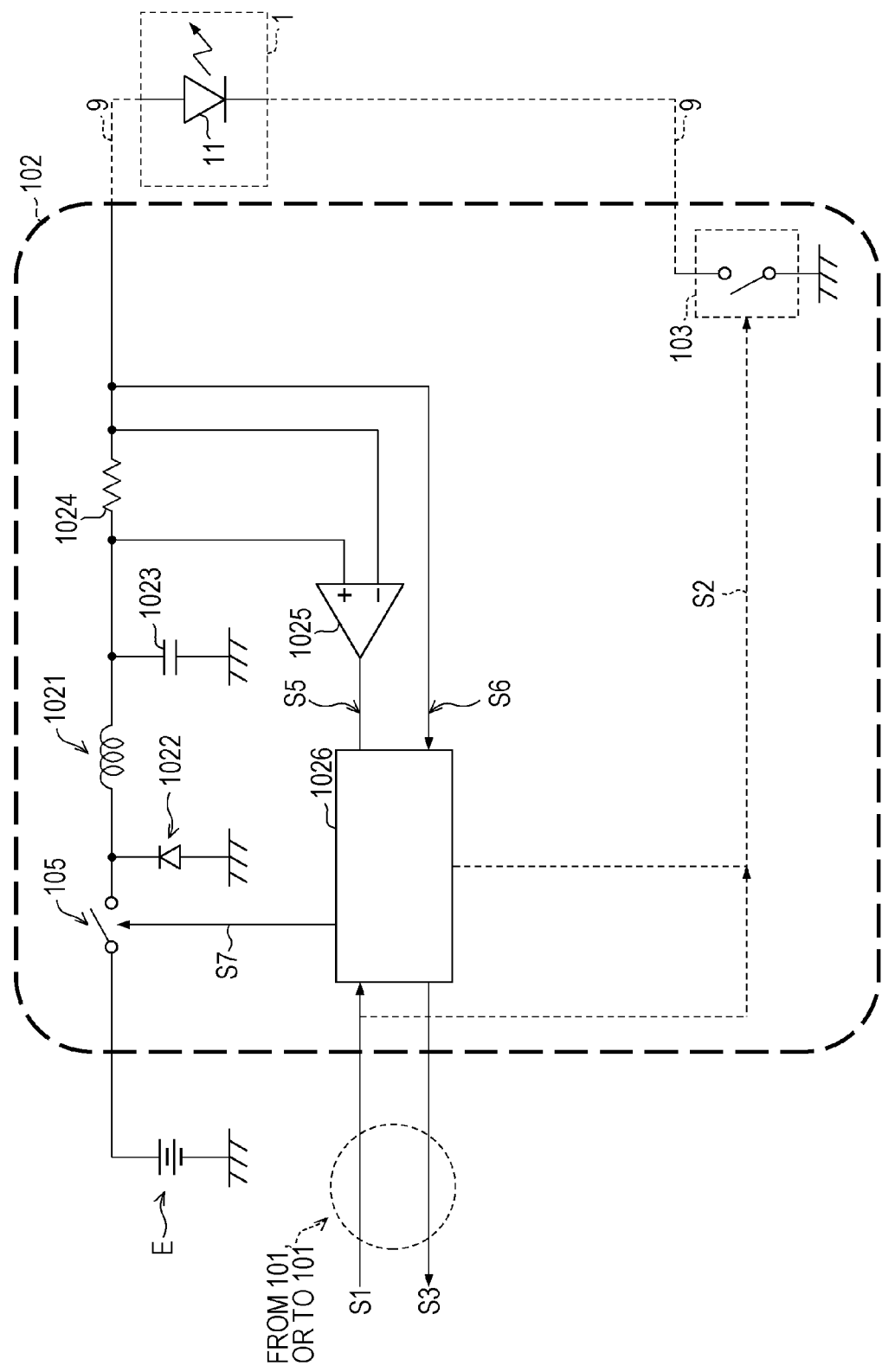
FIG. 6 is a block diagram which illustrates an example of the laser driving unit (step-down type) in the laser driving circuit.

FIG. 6 is a block diagram which illustrates a circuit configuration of a laser driving unit 102 (step-down type) in Example 3. It is an example of a step-down circuit which is used in a case in which a voltage which is necessary for driving a laser light source 1 is lower than a voltage of a power source E. In addition, the laser driving unit 102 in Example 3 is used when the number of series of LD chips 11 included in the laser light source 1 is small.

As illustrated in FIG. 3, the laser driving unit 102 includes a main switching element 105, a coil 1021, a diode 1022, a current detecting resistor 1024, a differential amplifier 1025, a switching control unit 1026, and the above described output switching element 103. In addition, one end of the coil 1021 is connected to a power source E. In addition, a separate switching element may be provided between the power source E and the coil 1021.

In addition, the laser driving unit 102 in Example 3 is connected to the laser light source 1 including a signal LD chip 11.

The switching control unit 1026 receives a signal S1 from the laser control unit 101, and returns a signal S3 to the laser driving unit 102. The same is applied to the signals 1 and 3. In addition, the switching control unit 1026 switches energizing (ON) and non-energizing (OFF) of the main switching element 105, when receiving the signal S1, so that a (desired) current which is instructed in the laser light source 1 flows.

During an ON period of the main switching element 105, a current from the power source E is accumulated as a magnetic flux energy thorough the coil 1021, and is accumulated in the capacitor 1023 as a charge. The current is also supplied to the laser light source 1. The current which is supplied to the laser light source 1 is detected by the current detecting resistor 1024 and the differential amplifier 1025, and turns ON/OFF the main switching element 105 so as to maintain a driving current value which is instructed by the laser control unit 101.

During the OFF period, the magnetic flux energy of the coil 1021 is supplied to the capacitor 1023, and the laser light source 1 through the diode 1022. The capacitor 1023 performs a smoothing operation for smoothing a fluctuation of a voltage (current) which flows into the laser light source 1 by performing switching of ON and OFF of the main switching element 105. A signal S6 (output voltage signal) is used for monitoring whether or not a voltage is output according to an instruction from the laser control unit 101. In addition, the signal 6 is used for turning off the main switching element 105, and decreasing an output voltage (OFF) by assuming that an open fault of the laser light source 1, or a failure of the laser driving unit 102 has occurred, when an abnormally high voltage is observed.

In addition, the routing of the wiring 9, and the effect thereof are the same as those in Example 1. Hereinafter, similar descriptions will be omitted.

In addition, similarly to other Examples, due to a breakage of a part of the wiring 9 (security wire), it is possible to perform instant and reliable cutting off of a current which flows into the laser light source 1 with respect to a deviation or damage of the optical member, regardless of operations of other elements.

EXAMPLE 4

Figure 7:
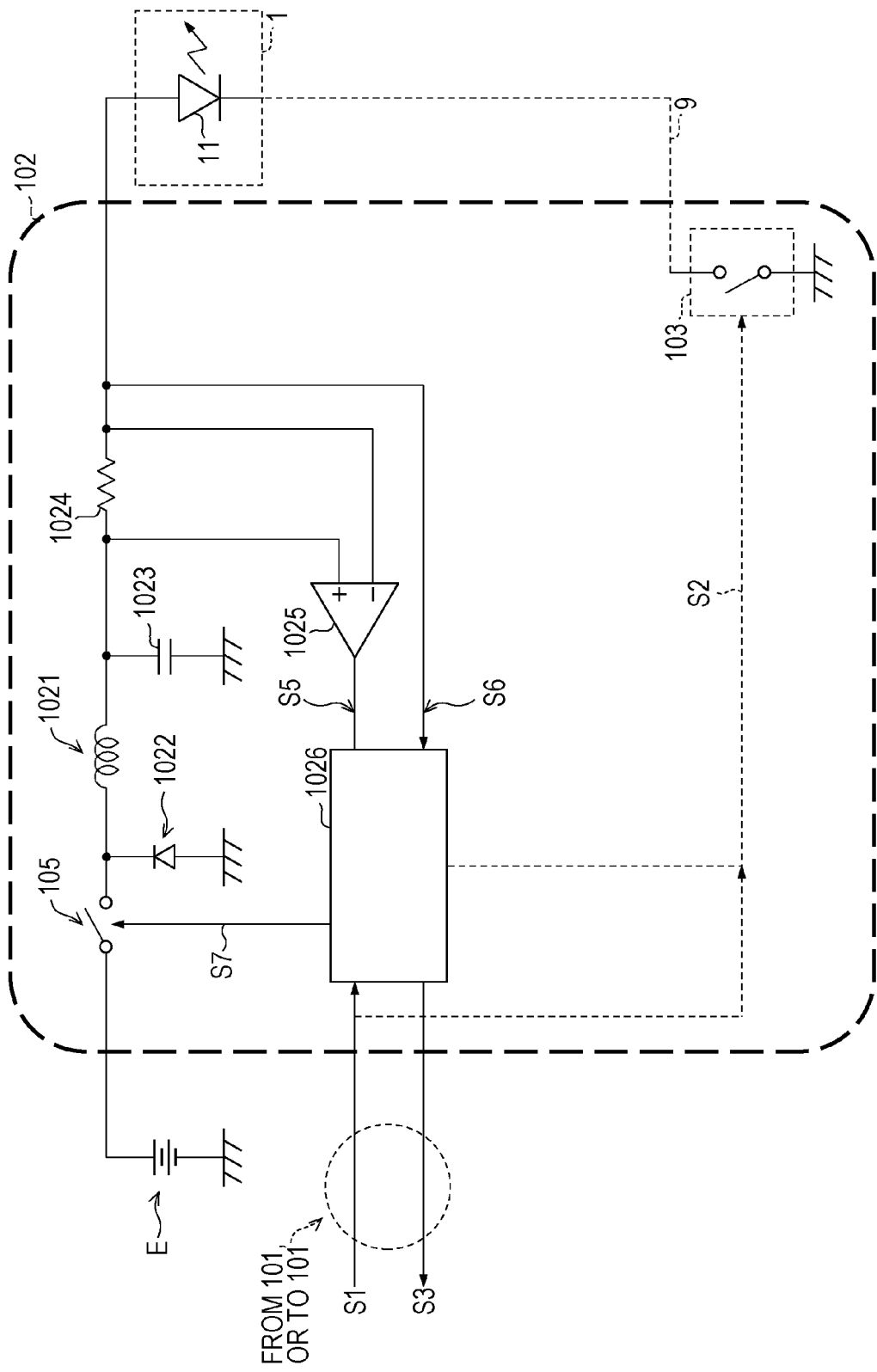
FIG. 7 is a block diagram which illustrates another example of the laser driving unit (step-down type) in the laser driving circuit.

Subsequently, FIG. 7 is a block diagram which illustrates a circuit configuration of a laser driving unit 102 (step-down type) in Example 4.

A difference in a laser driving unit 102 in Example 4 from that in Example 3 is that a part of wiring 9 (security wire) which is guided to a laser light source 1, a lens for excitation 2, a luminous body 4, a half parabolic mirror 5P, a base 5h, a laser cut filter 6, fixing members 7a to 7f, the surface, or the vicinity of a sealing housing 20, and a seal 21 is a portion which is denoted by a dashed line (wiring on reference potential side).

Accordingly, even if a part of the wiring 9 makes a fault contact, it is possible to prevent a damage of the laser light source 1, since an excessive current, or a reverse voltage is not applied to the laser light source 1.

In addition, when routing of the wiring 9 is long, there is a case in which a negative surge (voltage) occurs on the GND side (reference potential side) of the laser light source 1 due to a parasitic inductance pa1 which is proportional to the length of the wiring 9, when trying to turn off a driving current. This may cause a damage in the laser light source 1. In order to prevent this, it is preferable to turn off an output switching element 103 after mildly stopping a current of the laser light source 1, by stopping switching in a switching control unit 1026, first, at an OFF time of the laser light source 1, and to start an operation of the switching control unit 1026 after turning on the output switching element 103 in advance at an ON time of the laser light source 1. As a matter of course, it is not limited to this when an emergent lights-out is necessary in case of an occurrence of accident.

In addition, similar to other Examples, due to a breakage of a part of the wiring 9 (security wire), it is possible to perform instant and reliable cutting off of a current which flows into the laser light source 1 with respect to a deviation or damage of the optical member, regardless of operations of other elements.

EXAMPLE 5

Figure 8:
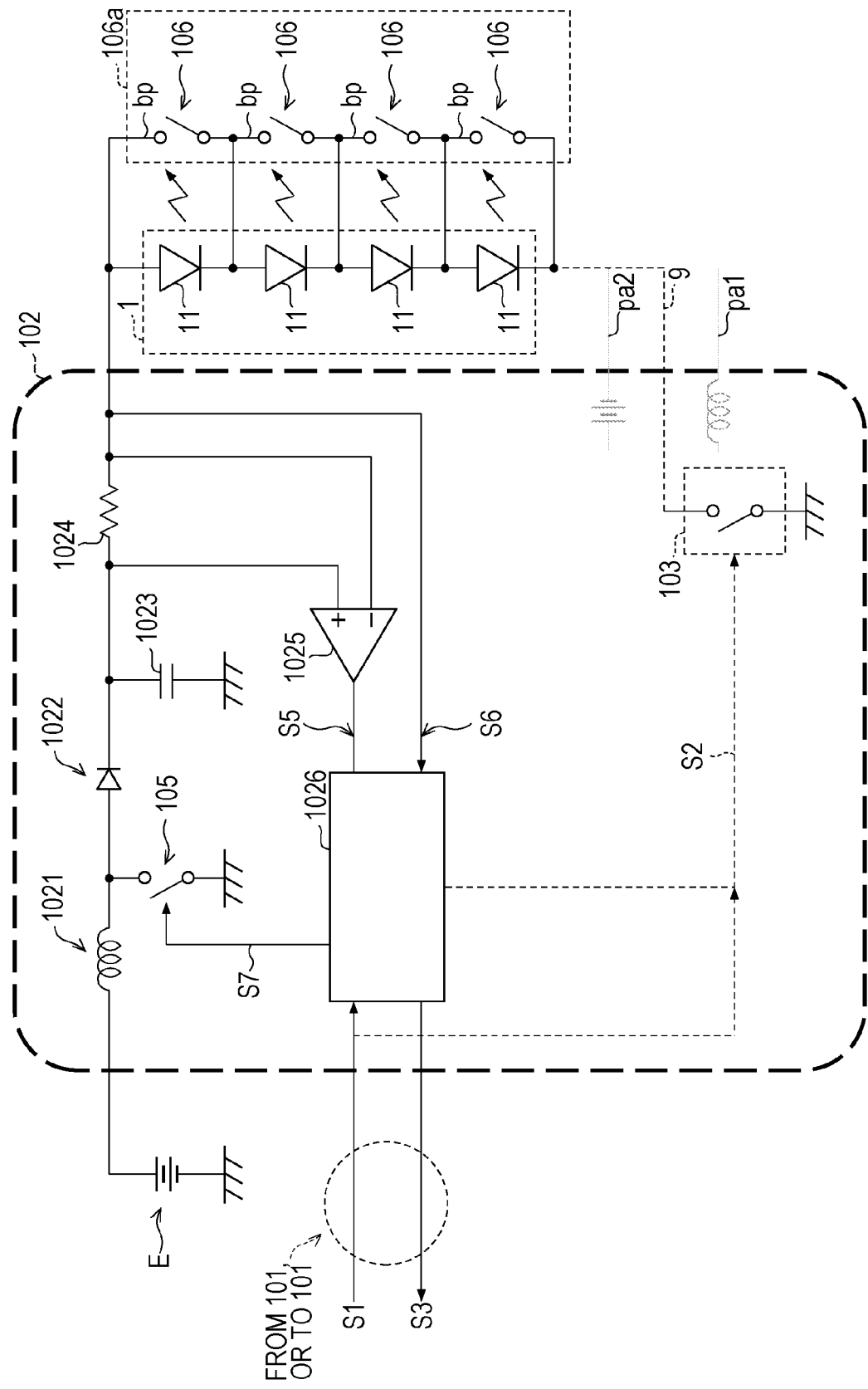
FIG. 8 is a block diagram which illustrates further another example of the laser driving unit (step-up type) in the laser driving circuit.

Subsequently, FIG. 8 is a block diagram which illustrates a circuit configuration of a laser driving unit 102 (step-up type) in Example 5.

A difference in a laser driving unit 102 in Example 5 from that in Example 2 is that the laser driving unit is provided with four bypass current paths by which bypass both electrodes of four LD chips 11 configuring a laser light source 1, respectively, and bypass switching elements 106 at each of the four bypass current paths bp. In addition, hereinafter, the four bypass switching elements 106 are referred to as a bypass switching element group 106a in a lump.

In addition, at an OFF time of the laser light source 1, the laser control unit 101 instructs a stop of driving (stop stepping up) with respect to the switching control unit 1026, and turns on the bypass switching element group 106*a*.

Here, reasons for providing the bypass current path by and the bypass switching element group 106*a* will be described. In addition, hereinafter, the wiring 9 will be described by assuming that the wiring is subject to long routing.

The first reason is to prevent a delay of turning off (lights-out) due to the parasitic inductance pa1 which continuously let a current flow, even though the laser light source 1 is not destroyed, in a case in which the output switching element 103 is turned off for emergent lights-out. In addition, when the output switching element 103 has enough withstand voltage, the laser light source 1 is not damaged, and the turning off is not delayed even when a reverse voltage pa2 is generated. However, even when the output switching element 103 cannot endure the voltage, is subject to a breakdown (surrender), and is conducted, if the bypass switching element group 106*a* is turned on simultaneously with the lights-out, or before the lights-out, the laser light source 1 is not damaged, and the delay of lights-out does not occur.

The second reason is that there is a case in which the above described reverse voltage pa2 is generated, in particular, at the OFF time due to the energy which is accumulated in the coil 1021 and the capacitor 1023, when a current of the laser light source 1 is turned on, or off using the above described output switching element 103 in a state in which the laser driving unit 102 is operated. This may be a case in which, for example, the output switching element 103 is provided so as to perform pulse driving of the laser light source 1, and an ON and OFF operation thereof is performed.

In addition, when the output switching element 103 is turned off in order to turn off the laser light source 1 for a long time, the bypass switching element group 106*a* continuously turned off at the same OFF timing of the output switching element 103, or according to the instruction on a stop of driving (stop of stepping-up) from the laser control unit 101.

In addition, at the time of pulse driving, the output switching element and the bypass switching element group 106*a* may perform switching of ON and OFF at almost the same time.

If the bypass switching element group 106*a* is provided as the bypass current path by at the time of an open fault when the LD chips 11 are connected in series, the bypass switching element group can also be used as the bypass current path. In that case, the additional component is not necessary.

In addition, when a protection from a surge is the sole purpose, it is not necessary to provide an individual bypass current path by and bypass switching element 106 at both electrodes of each LD chip 11 as in the laser driving unit 102 according to the Example.

According to the above examination result, arranging methods of the bypass current path by and the bypass switching element 106 when the laser light source 1 is configured by the plurality of LD chips 11 which are connected to one another in series are gathered up as follows.

That is, among all of the plurality of LD chips 11 which are included in the laser light source 1, a plurality of LD chip 11 groups as a result of grouping of at least any one of a group which is formed only by a single LD chip 11, and a group which is formed by two or more LD chips 11 which are connected to one another will be taken into consideration.

At this time, the bypass switching element group 106*a* may have a configuration in which the plurality of bypass current paths by which bypass both electrodes of the plurality of LD chip 11 groups, respectively, and the plurality of bypass switching elements 106 for switching conduction and non-conduction of each of the plurality of bypass current paths by are provided.

Here, a result in which all of the plurality of LD chips 11 included in the laser light source 1 are grouped in the plurality of LD chip 11 groups can be taken into consideration in the following cases (1) to (3).

(1) A case in which all of the plurality of LD chips 11 groups are groups which are configured only by a single LD chip 11.

(2) A case in which all of the plurality of LD chips 11 groups are groups which are configured by two or more LD chips 11.

(3) A case in which, among the plurality of LD chips 11 groups, a part of LD chip 11 groups is a group which is configured only by a single LD chip 11, and LD chip 11 groups excluding that are groups which are configured by two or more LD chips 11.

In addition, "groups which are configured by two or more LD chips 11 connected to one another (LD chip 11 group)" also include any one of a case in which two or more LD chips 11 are connected one another only in series, a case in which two or more LD chips 11 are connected to one another only in parallel, and a case in which two or more LD chips 11 are connected to one another in a state in which a series connection and a parallel connection are mixed.

In addition, when two or more LD chips 11 are connected to one another in a state in which a series connection and a parallel connection are mixed, both electrodes of the LD chip 11 groups become both end terminals of a path in which the number of connections of the LD chip 11 becomes maximum, among paths which connect the plurality of LD chips 11 which are included in the group.

In addition, the bypass switching element group 106*a* is provided outside the laser driving unit 102, however, the bypass switching element group may be provided inside the laser driving unit 102.

In addition, all of the short-circuit operations of the bypass switching element group 106*a* are set to a timing which is earlier than the output switching element 103 (direct cutoff switch), and is later than shutdown of the laser driving circuit 100. It is preferable that opening of the short-circuit operation be set to a timing after the same timing as the ON time of the direct cutoff switch, or a timing up to starting of the laser driving circuit 100, however, the timing is not limited to this when there is no damage in each element, or a circuit portion.

In addition, similarly to other Examples, due to a breakage of a part of the wiring 9 (security wire), it is possible to perform instant and reliable cutting off of a current which flows into the laser light source 1 with respect to a deviation or damage of the optical member, regardless of operations of other elements.

EXAMPLE 6

Figure 9:
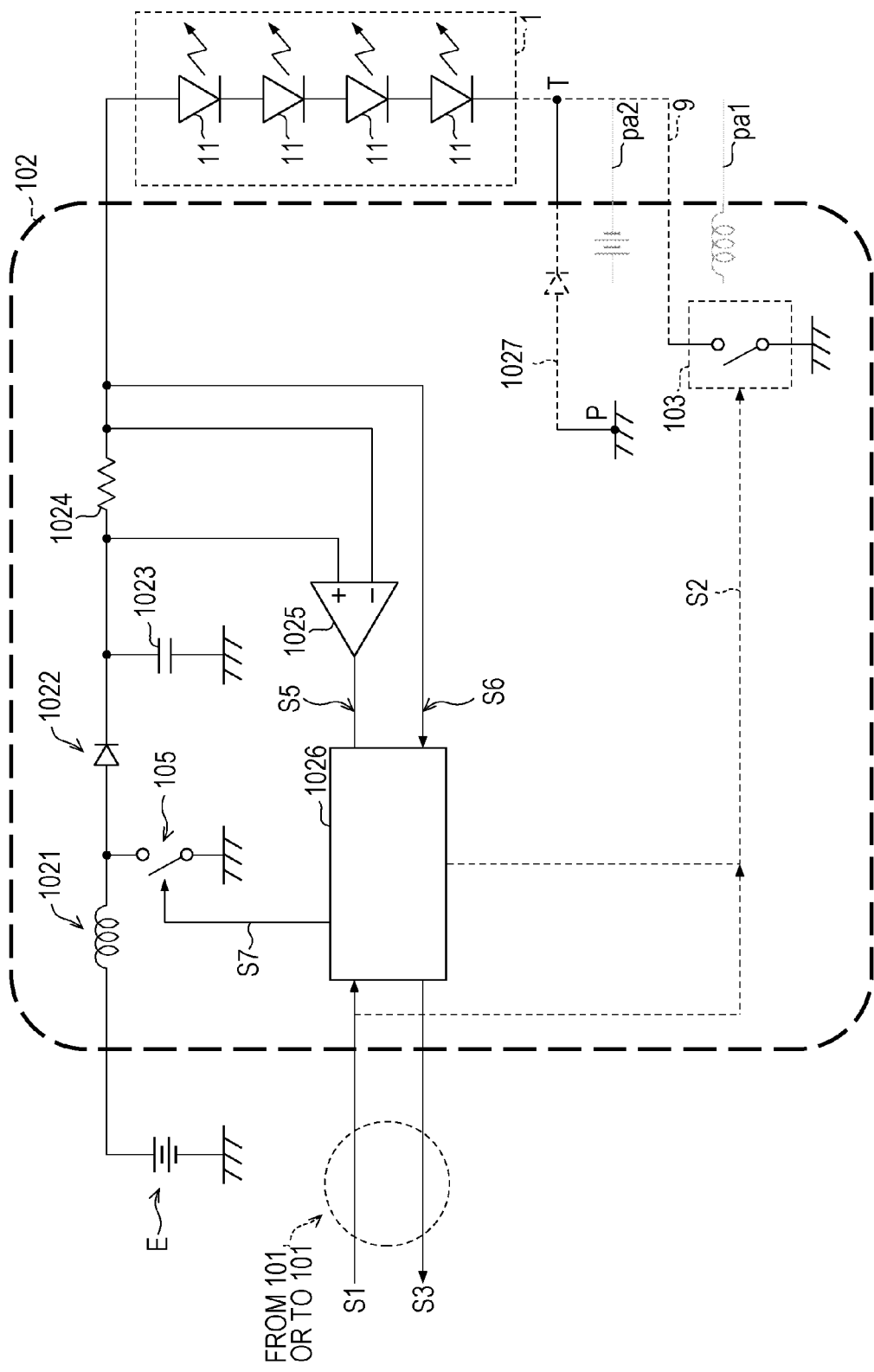
FIG. 9 is a block diagram which illustrates still further another example of the laser driving unit (step-up type) in the laser driving circuit.

Subsequently, FIG. 9 is a block diagram which illustrates a circuit configuration of a laser driving unit 102 in Example 6 (step-up type).

A difference in the laser driving unit 102 in Example 6 from that in Example 2 is that a (negative) diode for clamping (first selective conduction element) 1027 is provided by setting a direction going toward a terminal T on the reference potential side of the laser light source 1 from a reference potential point P to a forward direction.

Hereinafter, a reason for providing the above described diode for clamping 1027 will be described. First, in Example 6, a part of the wiring 9 (security wire) uses wiring (portion of dashed line) on the reference potential side of the laser light source 1. Accordingly, if the wiring 9 is broken, the laser light source 1 is naturally turned off, however, in the state, even when a fault contact with a voltage lower than the reference potential occurs in the wiring 9 on the reference potential side (GND side) of the laser light source 1 in the fault contact which is illustrated in previous Example 5, the diode for clamping 1027 prevents the laser light source 1 from being applied with an excessive current or voltage, and accordingly, it is possible to prevent destroying of the laser light source 1, and a useless light emitting (delay of lights-out). This is a new effect which is generated in addition to the effects illustrated in the previous Examples.

In addition, as a secondary effect, it is possible to prevent the breakdown of the laser light source 1 due to a presence of the diode for clamping 1027, for example, even when the reverse voltage pa2 which is generated by the parasitic inductance pa1 exceeds the withstand voltage of the output switching element 103, and causes a breakdown (conduction) at the OFF time of the output switching element 103, it is possible to prevent destroying of the laser light source 1 in a form in which a current path in the vicinity of the diode for clamping 1027 becomes a current path with respect to the reverse voltage pa2, and subrogate an unexpected current which flows into the laser light source 1.

In addition, similarly to other Examples, due to a breakage of a part of the wiring 9 (security wire), it is possible to perform instant and reliable cutting off of a current which flows into the laser light source 1 with respect to a deviation or damage of the optical member, regardless of operations of other elements.

EXAMPLE 7

Figure 10:
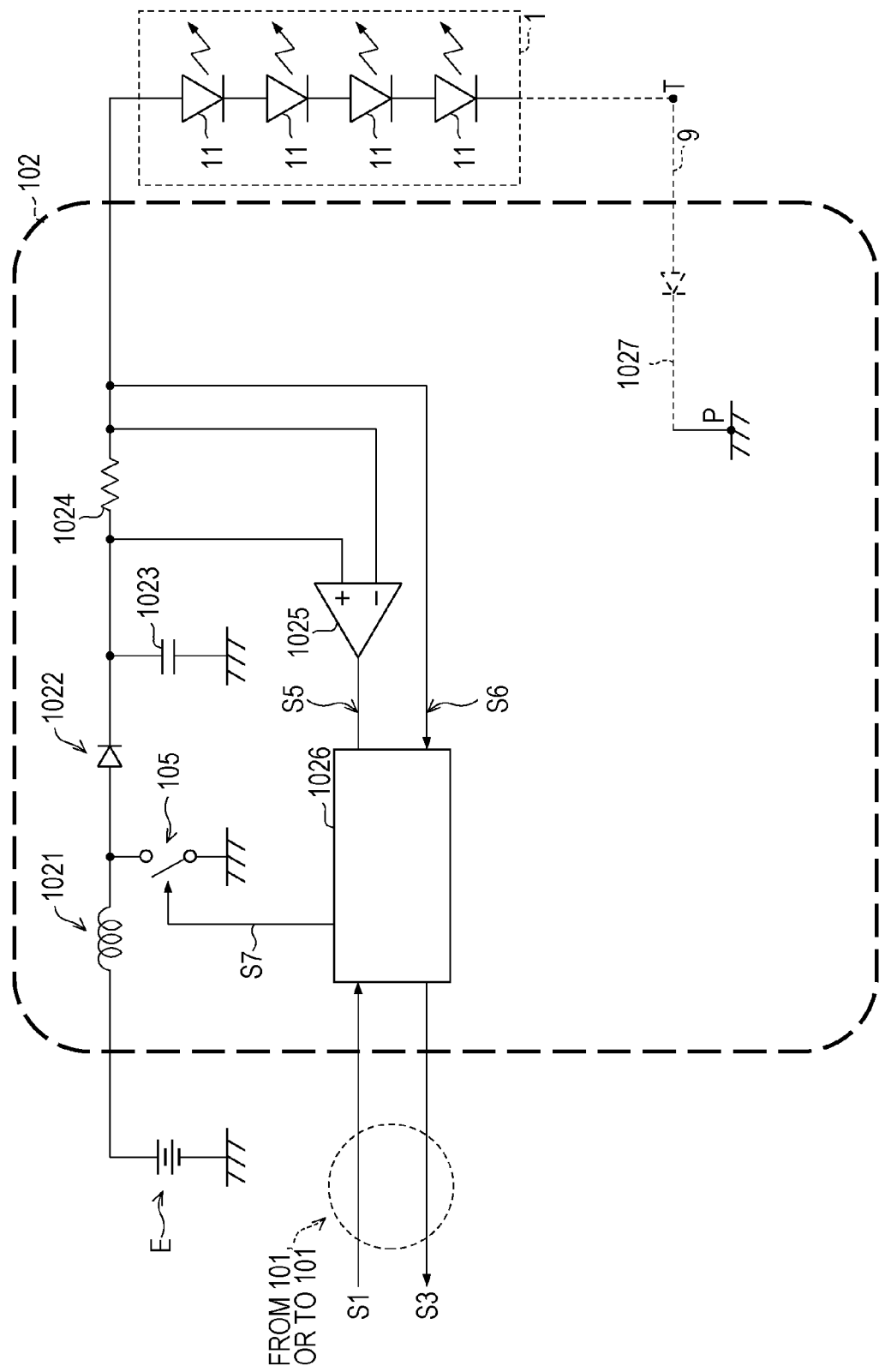
FIG. 10 is a block diagram which illustrates still further another example of the laser driving unit (step-up type) in the laser driving circuit.

Subsequently, FIG. 10 is a block diagram which illustrates a circuit configuration of a laser driving unit 102 (step-up type) in Example 7.

A difference in the laser driving unit 102 in Example 7 from that in Example 2 is that a (positive) diode for clamping (first selective conduction element) 1027 is provided by setting a direction going toward the reference potential point P from a terminal T on the reference potential side of the laser light source 1 to a forward direction, and the output switching element 103 is eliminated.

The (positive) diode for clamping 1027 serves as a current path in the forward direction for the laser light source 1. Accordingly, while the laser driving unit 102 is driving the laser light source 1, a current path which does not depend on an ON/OFF of the output switching element 103 as is provided in the previous Example is formed, and the laser light source 1 continuously emits light. Accordingly, for example, it is not necessary to provide the output switching element 103, differently from Example 5, Example 6, or the like.

However, the following merits can be obtained by providing the (positive) diode for clamping 1027.

When it is assumed that a portion which is denoted by a dashed line (security wire) is in a fault contact with a portion having a different potential or voltage, and if the partner is a chassis potential (ground potential) of a vehicle, there is no problem as described in advance, however, if a voltage on the partner side which is in a fault contact with the portion denoted by the dashed line is a voltage higher than a reference potential such as a power source voltage, or the like, there is a possibility of a danger in which the laser light source 1 may be applied with a reverse voltage, and the laser light source 1 may be damaged. In addition, the LD chip 11 is considerably weak to a reverse voltage compared to a forward voltage which is necessary when performing normal lighting.

Therefore, even when a part of the wiring 9 which should be close to the GND potential is cut off, or is in a fault contact, and a potential of the partner of the fault contact is high, the laser light source 1 is protected from destroying by clamping (maintaining) the potential of the wiring 9 in approximately the GND potential using the diode for clamping 1027.

In addition, even when the surge voltage which is described in the previous Example 6 is generated in the reverse direction at the ON time of the laser light source 1, the (positive) diode for clamping 1027 is effective, and the laser light source 1 is protected by guiding the surge voltage to the GND.

In addition, naturally, the (positive) diode for clamping can also be used along with a negative diode for clamping. When using together, the merit of providing the output switching element 103, for example, the high-speed lighting can be achieved by providing the same bypass switch group 106a as that in Example 5 (FIG. 8), turning on the bypass switch group at the time of lights-out of the laser light source 1.

In addition, similarly to other Examples, it is possible to perform instant and reliable cutting off of a current which flows into the laser light source 1 due to a breakage of a part of the wiring 9 (security wire) with respect to a deviation or damage of the optical member. There is a possibility that lights-out at the time of normal lights-out (or, at the time of lights-out when detecting an abnormal state using separate means such as microprocessor) may be delayed a little in a case of the Example in which diode for positive clamping is provided, since the output switching element 103 is not provided, however, when actual deviating or damaging of the optical member, such as a breakage of the wiring 9 occurs, it is possible to instantly turn off the laser light source 1, regardless of the above described case. This does not depend on operations in other elements such as the bypass switch group 106a, the ON/OFF of the output switching element 103, or the like.

EXAMPLE 8

Figure 11:
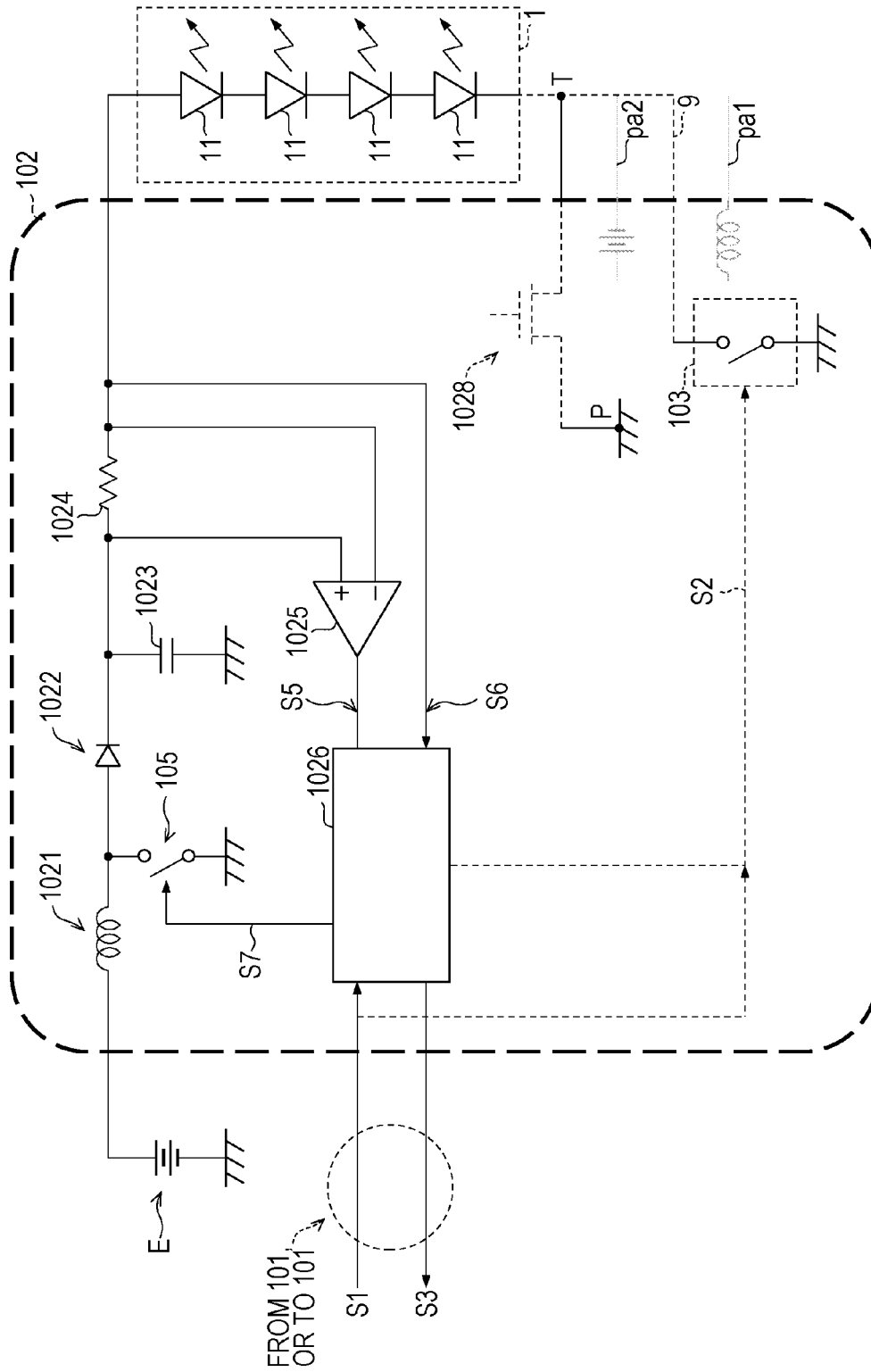
FIG. 11 is a block diagram which illustrates still further another example of the laser driving unit (step-up type) in the laser driving circuit.

Subsequently, FIG. 11 is a block diagram which illustrates a circuit configuration of a laser driving unit 102 (step-up type) in Example 8.

A difference in the laser driving unit 102 in Example 8 from that in Example. 6 (or Example 7) is that an abnormal voltage preventing switching element (second selective conduction element) 1028 is provided between the terminal T on the reference potential side of the laser light source 1 and the reference potential point P.

The abnormal voltage preventing switching element 1028 is turned on (conduction) at a point of time when a surge of a negative voltage is generated on the GND side of the laser light source 1 (that is, OFF time of laser light source 1, OFF time of output switching element 103), as described in the previous Example 6 or 7. It is similar to that in the previous Example 6, however, a voltage after clamping by only the forward voltage of the diode for clamping 1027 remains in Example 6, and in contrast to this, in the Example using the abnormal voltage preventing switching element 1028, basically, only an ON resistance of the abnormal voltage preventing switching element 1028 is viewed, and the forward voltage is considered to be approximately zero by depending also on an amount of a surge current, which is therefore an advantage in terms of clamp (surge suppression.)

However, when a part of the wiring 9 (portion of dashed line, security wire) makes a false contact with an electric-equipment system having a high potential, since it is difficult to know a timing of the fault contact, it is not possible to protect the laser light source 1 using the abnormal voltage preventing switching element 1028 in the Example. Accordingly, in this case, it is more desirable that the abnormal voltage preventing switching element 1028 and the (positive) diode for clamping 1027 described in the previous Example be combined. As described above, in the combination, it is preferable to provide the bypass path switch 106*a* in Example 5, for example, instead of the output switching element 103.

In addition, in order to protect the laser light source 1 from the fault contact with a negative surge (reverse voltage pa2), or a voltage which is lower than the reference potential due to the parasitic inductance pa1 of a part of the wiring 9 (portion of dashed line), it is also possible to use the (negative) diode for clamping 1027 in the previous Example 6 together.

In addition, similar to other Examples, due to a breakage of a part of the wiring 9 (security wire), it is possible to perform instant and reliable cutting off of a current which flows into the laser light source 1 with respect to a deviation or damage of the optical member, regardless of operations of other elements.

EXAMPLE 9

Figure 12:
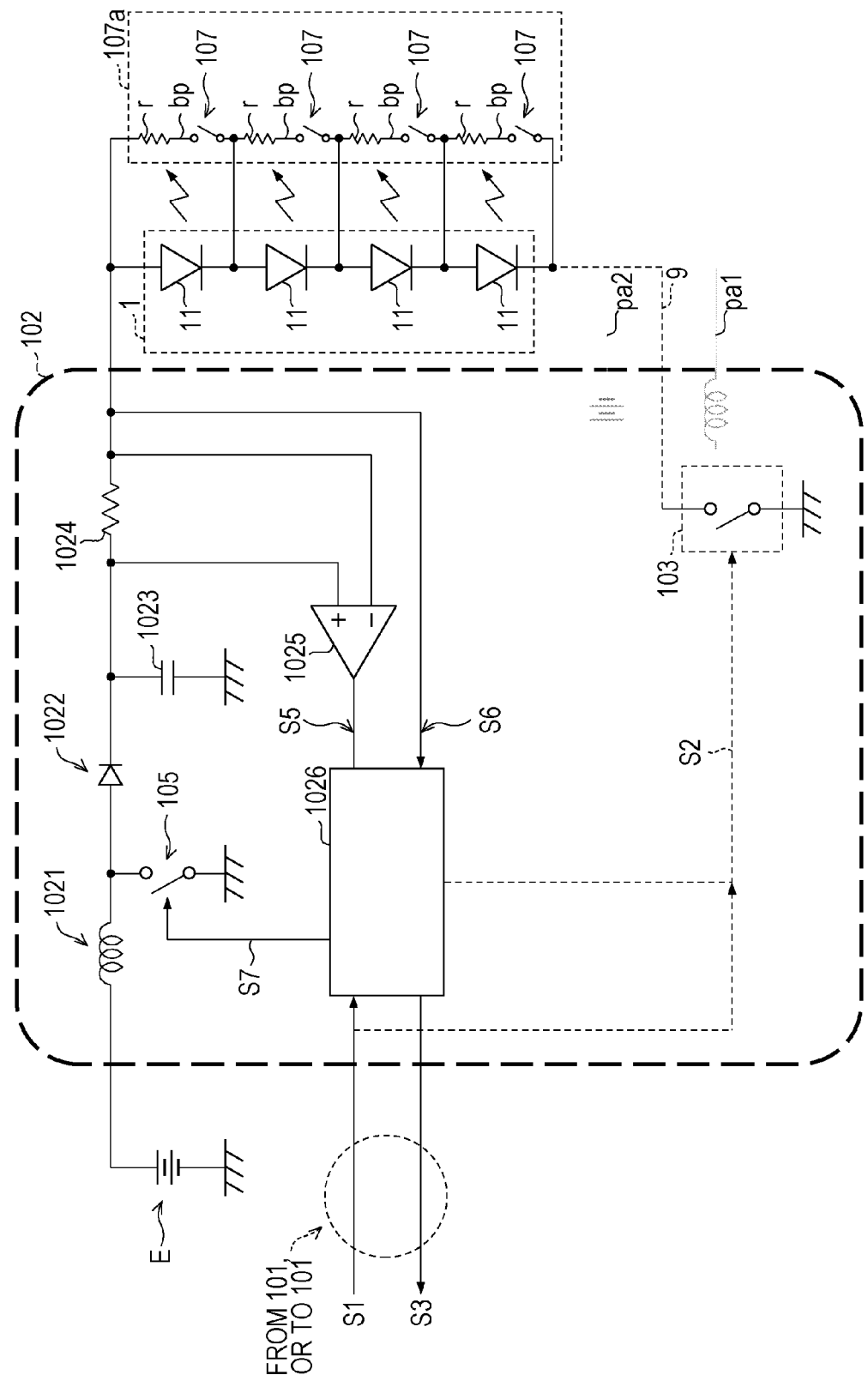
FIG. 12 is a block diagram which illustrates still further another example of the laser driving unit (step-up type) in the laser driving circuit.

Subsequently, FIG. 12 is a block diagram which illustrates a circuit configuration of a laser driving unit 102 (step-up type) in Example 9.

An only difference in the laser driving unit 102 in Example 8 from that in Example 5 is that a bypass resistor r is provided in series with respect to the bypass switching element 106 in each of the bypass current paths by in the bypass switching element group 106*a*. Here, in order to make the difference clear, the bypass switching element is referred to as 107, and a group thereof is referred to as 107*a*.

Here, a reason for providing the bypass resistor r will be described. The laser control unit 101 gives an instruction on a stop of driving (stop of stepping-up) with respect to the switching control unit 1026 at the time of lights-out of the laser light source 1, and turn on the bypass switching element group 107*a*, however, since an output from the laser driving unit 102 is not directly short-circuited by the bypass switching element 106 even when the bypass switching element group 107*a* is turned on while the laser driving unit 102 is still performing an output (driving) operation when the bypass resistor r is input in this manner, it is possible to set an ON timing in the bypass switching element group 107*a* to be earlier than an operation stop timing in the laser driving unit 102. That is, high-speed lights-out can be performed since it is possible to perform a short circuit of both ends of the LD chip 11 group (each LD chip 11) before cutting off a current to the laser light source 1 (including OFF of output switching element 103), to increase a protecting effect of the LD chip 11, and to become a substitute current path with respect to a surge (reverse power). In addition, since the output of the laser driving unit 102 is connected to the reference potential GND through the bypass switching element group 107*a*, and through a resistance included therein at any of a lighting time and a lights-out time of laser, and the output of the laser driving unit 102 is not directly short-circuited to the GND, for example, a possibility that an excessive current flows into the diode 1022, the coil 1021, and the like, and the diode, the coil, and the like are damaged can be removed.

In addition, a switching control timing of the bypass switching element group 107*a* is not tight, may be turned off after starting the operation of the laser driving unit 102 (start lighting operation of laser light source 1), and similarly, may be turned on before stopping the operation (turning off of laser light source 1), and accordingly, a control thereof is easy.

If the bypass switching element group 107*a* is provided as a bypass current path at the time of an open fault when the LD chips 11 are connected in series, the bypass switching element group can also be used as the bypass current path, and in this case, additional components are not necessary.

In addition, the bypass resistor r may have a constitution in which, for example, a part of the heat generating conductor 9*b* which is described in FIG. 14 is cut, and the resistor is connected. With this configuration, the number of LD chips 11 which is turned on is reduced when the bypass switching element 107 is turned on, however, when turning on of the laser light source 1 is not necessary, for example, during a stop of a vehicle, it is possible to contribute to anti-fog as a heater. In addition, when being also used as the bypass current path for the open fault, it is possible to use an amount of consumption of electricity by that much in the anti-fog, when the LD chip 11 is broken, it leads to an effective use of electricity, compared to a case of radiating as heat in a simple resistor.

In addition, similarly to other Examples, due to a breakage of a part of the wiring 9 (security wire), it is possible to perform instant and reliable cutting off of a current which flows into the laser light source 1 with respect to a deviation or damage of the optical member, regardless of operations of other elements.

EXAMPLE 10

Figure 13:
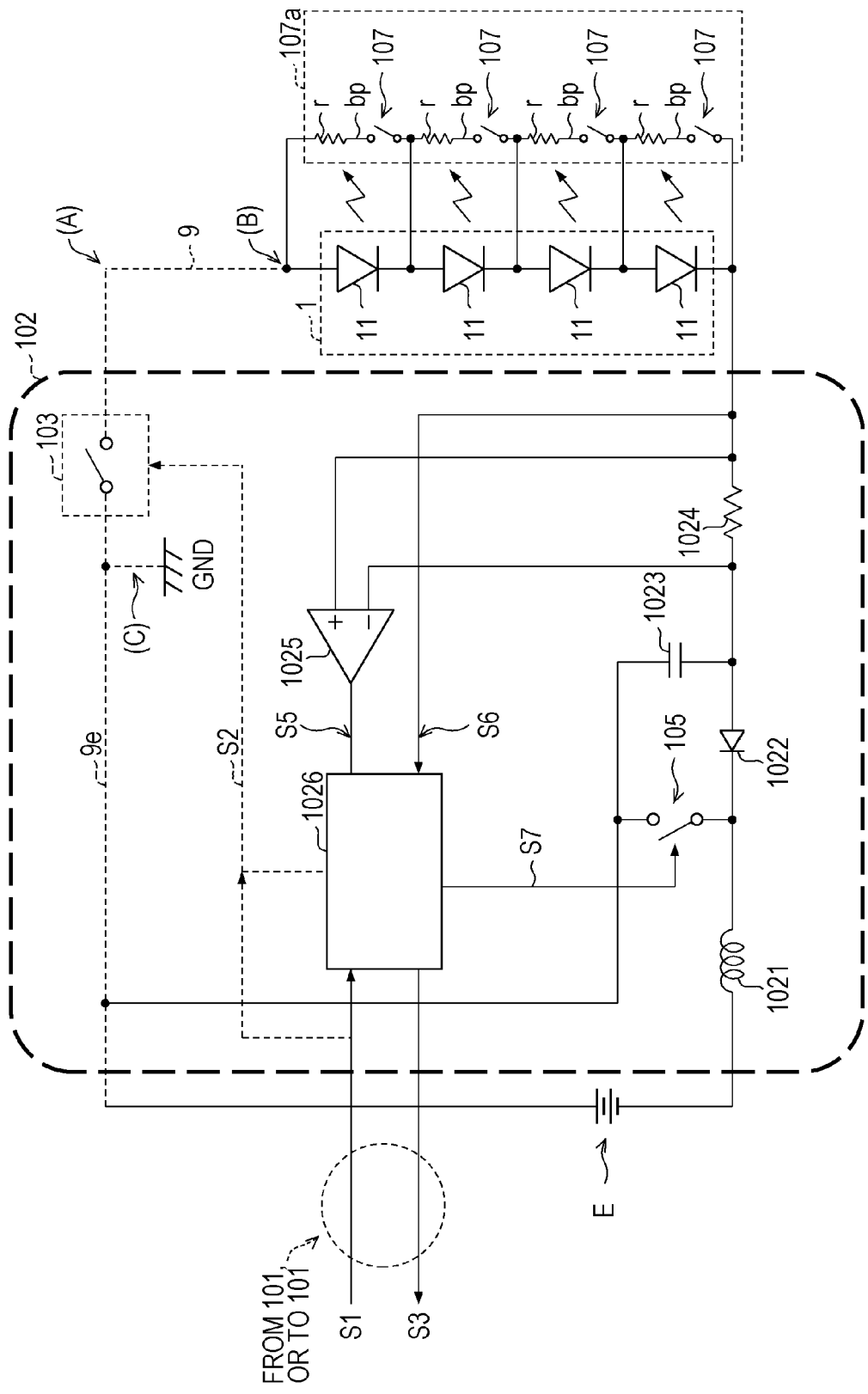
FIG. 13 is a block diagram which illustrates an example of the laser driving unit (when reference potential side is anode side of power source) of the laser driving circuit.

Subsequently, FIG. 13 is a block diagram which illustrates a circuit configuration of a laser driving unit 102 in Example 10. The Example 10 is an example of a circuit configuration of a case in which the reference potential side is an anode side of a power source E, not a negative side thereof.

The switching control unit 1026 receives a signal S1 from the laser control unit 101, and returns a signal S3 to the laser driving unit 102. The same is applied to the signals 1 and 3. In addition, the switching control unit 1026 switches energizing (ON) and non-energizing (OFF) of the main switching element 105 when receiving the signal S1 so that a (desired) current which is instructed in the laser light source 1 flows.

During an ON period of the main switching element 105, a current from the power source E is accumulated as a magnetic flux energy through the coil 1021, and is accumulated in the capacitor 1023 as a charge. In the mean time, a current from the capacitor 1023 is supplied to the laser light source 1.

On the other hand, the magnetic flux energy of the coil 1021 becomes a current, charges the capacitor 1023 through the diode 1022 by being in series with a voltage of the power source E, and the current is also supplied to the laser light source 1, during an OFF period of the main switching element 105.

The current which is supplied to the laser light source 1 is detected by the current detecting resistor 1024 and the differential amplifier 1025, and turns on/off the main switching element 105 so as to maintain a driving current value which is instructed by the laser control unit 101.

A point (A) in the figure serves as a part of the wiring 9 (security wire). In addition, a point (B) becomes one end when connecting a surge, a diode for preventing a fault contact, or a switching element (diode for clamping 1027, or abnormal voltage preventing switching element 1028), and an element is provided between the point and a point (C) as a reference potential (GND) of the laser driving circuit 100.

In addition, Examples 1 to 10 describe that both of the positive side and the negative side of the power source E (battery) as the GND are treated as the reference potential, however, as an extreme example, it is also possible to have a structure in which the entire laser driving circuit 100, including the power source E, is electrically floated from a chassis of a vehicle, including the laser light source 1. In this case, a connection destination on one end of the previously described surge or an element for preventing a fault contact (diode for clamping 1027, or abnormal voltage preventing switching element 1028) becomes a potential on the positive side of the power source E (portion of dashed line on wiring 9e side), not the GND.

That is, since it is possible to construct any one of the positive side and negative side of the power source E as the reference potential, or it is also possible to make a complete floating state, a degree of freedom in circuit designing increases, and it is possible to perform a function of preventing a leak of laser light at the time of breaking using both configurations of positive grounding and negative grounding.

In addition, similar to other Examples, due to a breakage of a part of the wiring 9 (security wire), it is possible to perform instant and reliable cutting off of a current which flows into the laser light source 1 with respect to a deviation or damage of the optical member, regardless of the ON/OFF of the bypass switching element group 106a, or the output switching element 103, and regardless of operations of other elements.

(Another Expression of the Present Invention)

In addition, the present invention may be expressed as follows.

In addition, in the light emitting device according to the present invention, as an installation method of a part of the above described wiring, (1) a case in which a part of the wiring is installed on at least one surface of the laser light source and the optical member, or in the vicinity thereof, (2) a case in which a part of the wiring is installed on the surface of a fixing member for fixing at least one of the laser light source and the optical member, or in the vicinity thereof, or the like, can be exemplified.

However, the installation method of a part of the wiring is not limited to this. That is, a part of the wiring may be installed at a portion assumed to have a possibility of a dangerousness which is caused by the laser light due to an occurrence of an accident.

In addition, in the light emitting device according to the present invention, a part of the above described wiring may have a structure in which a breakage easily occurs.

According to the above described configuration, when at least one of the laser light source and the optical member is deformed, or the installation position is changed, it is possible to increase a possibility of a breakage of a part of the wiring. As the "structure in which a breakage easily occurs", for example, a case in which a part of the wiring is made a connection portion of a conductor which is configured by a different material, a case in which a part of the wiring is made thinner than other portions, or a case in which a part of the wiring is formed in a shape which is easily disconnected is taken into consideration.

In addition, in the light emitting device according to the present invention, a part of the wiring may be a part of wiring on the reference potential side.

As in the above described configuration, if a part of the wiring is a part of wiring on the reference potential side, even when a part of the wiring is in a fault contact with a portion having a different potential or voltage for some reasons, it is difficult for an excessive voltage, current, or the like in the forward direction or the reverse direction to be added to the laser light source.

In other words, even if a wiring of an electric-equipment system having a different voltage is in contact for some reasons, and causes a fault contact, a discharge, or the like, since the discharging target is the wiring on the reference potential side at most, the excessive voltage, current, or the like does not easily occur in the laser light source. For this reason, it is possible to reduce a possibility that the laser light source may be destroyed due to a shock which is caused by a fault contact, a discharge, or the like.

In addition, in the light emitting device according to the present invention includes the bypass current path which bypasses both electrodes of the laser light source, and a bypass switching element which switches conduction and non-conduction of the bypass current path, and the bypass switching element may set the bypass current path to be conductive at the lights-out time of the laser light source.

In addition, in the light emitting device according to the present invention, the laser light source is configured by a plurality of semiconductor lasers which are connected to one another, and the device includes the plurality of bypass current paths which bypass both electrodes of each of the plurality of semiconductor laser groups which are divided into at least a group configured by the single semiconductor laser and a group configured by two or more semiconductor lasers which are connected one another, and the plurality of bypass switching elements which switch conduction and non-conduction of each of the plurality of bypass current paths, in which the bypass switching element may cause the bypass current path to be conductive at the time of lights-out of the laser light source.

Since the parasitic inductance increases according to the length of the wiring, when the wiring becomes long, the parasitic inductance becomes large. Accordingly, when the wiring is long, there is a possibility that the laser light source may be destroyed due to a large surge (rapid change in voltage or current) which is caused by the parasitic inductance at the time of lights-out of the laser light source. In addition, there is a possibility that the lights-out may be delayed since the parasitic inductance continuously causes a current to flow into the laser light source at the time of lights-out of the laser light source.

Therefore, in the above described configuration according to the present invention, the bypass switching element is set so as to make the bypass current path to be conductive at the time of lights-out of the laser light source.

In this manner, it is possible to reduce the possibility that the laser light source may be destroyed due to the large surge (or, semiconductor laser or semiconductor laser group) which is caused by the parasitic inductance at the time of lights-out of the laser light source. In addition, it is also possible to reduce the possibility that the lights-out of the laser light source may be delayed.

Here, as a result in which all of the plurality of semiconductor lasers which are included in the laser light source are divided into the plurality of semiconductor laser groups, the following cases (1) to (3) are taken into consideration.

(1) A case in which all of the plurality of semiconductor laser groups are groups configured only by a single semiconductor laser.

(2) A case in which all of the plurality of semiconductor laser groups are groups configured by two or more semiconductor lasers.

(3) A case in which a part of the semiconductor laser group among the plurality of semiconductor laser groups is a group configured only by a single semiconductor laser, and the other semiconductor laser groups are groups configured by two or more semiconductor lasers.

In addition, the "group configured by two or more semiconductor lasers which are connected to one another" includes a case in which two or more semiconductor lasers are connected to one another only in series, a case in which two or more semiconductor lasers are connected to one another only in parallel, and a case in which two or more semiconductor lasers are connected to one another in a state in which a series connection and a parallel connection are mixed.

In addition, when two or more semiconductor lasers are connected to one another in the state in which the series connection and the parallel connection are mixed, both electrodes of the semiconductor laser group become both end terminals of a path in which the number of connections of the semiconductor laser becomes a maximum, among paths in which the plurality of semiconductor lasers included in the group are connected one another.

In addition, the light emitting device according to the present invention may include the first selective conduction element which is selectively conductive between the terminal on the reference potential side and the reference potential point when a potential of the terminal on the reference potential side of the laser light source is higher, or lower than that in the reference potential point.

As described above, when the wiring is long, there is a dangerousness in which the laser light source is destroyed due to a large surge which is caused by the parasitic inductance at the time of lights-out of the laser light source. In addition, when another electric-equipment system with a high, or, on the contrary, low potential make contact by mistake with a part of the wiring on the reference potential side of the laser light source, there is a possibility that the laser light source may be damaged by being added with an unexpected reverse or forward voltage. In addition, there also is a possibility that lights-out of the laser light source may be delayed, since the parasitic inductance causes a current to continuously flow into the laser light source at the time of lights-out of the laser light source.

Therefore, in the above described configuration according to the present invention, the first selective conduction element is set to be selectively conductive between the terminal on the reference potential side and the reference potential point when the potential of the terminal on the reference potential side of the laser light source is higher or lower than that of the reference potential point.

In this manner, since a substitute path in which a current flows is formed between the terminal on the reference potential side of the laser light source and the reference potential point, it is possible to reduce the dangerousness of destroying the laser light source. In addition, it is also possible to reduce a possibility that the lights-out in the laser light source may be delayed.

In addition, the light emitting device according to the present invention may include the second selective conduction element which is selectively conductive between the terminal on the reference potential side of the laser light source and the reference potential point at a predetermined timing.

The second selective conduction element is selectively conductive between the terminal on the reference potential side of the laser light source and the reference potential point at a predetermined timing.

Here, the "predetermined timing" is a timing (time point) which is predetermined in anticipation of a time point, for example, at which a large surge may be generated on the reference potential side of the laser light source (lights-out of laser light source or the like).

As described above, since the second selective conduction element can suppress (clamp) the surge, regardless of the potential of the terminal on the reference potential side of the laser light source, it is better than the first selective conduction element in clamping.

In addition, a lighting system and a headlight including the above described light emitting device, and a vehicle including the headlight may be configured.

[Additional Matter]

In addition, the present invention is not limited to the above described embodiment, and various modifications can be made in a range which is disclosed in claims. That is, embodiments which are obtained by combining technical means which are appropriately modified in the range which is disclosed in claims is also included in a technical range of the present invention. In addition, embodiments which are obtained by appropriately combining technical means which are respectively disclosed at different portions of the embodiment for executing the present invention are also included in the technical range of the present invention.

Industrial Applicability

The present invention can be applied to a light emitting device, a lighting system and a headlight including the light emitting device, and a vehicle including the headlight, or the like. In addition, the lighting system (or headlight) can be applied to other lighting systems (or headlights), in addition to a headlight for vehicle. As an example of other lighting systems (or headlights), there is a downlight. The downlight is a lighting system which is provided on a ceiling of a structure such as a house, a vehicle, or the like. Further, in addition to that, the lighting system (or headlight) of the present invention may be realized as a head lamp of a mobile body excluding a vehicle (for example, human being, ship, air plane, submarine, rocket, or the like), and may be realized as indoor lighting equipment (floor lamp or the like) excluding a search light, a projector, a downlight, and external lighting equipment.

REFERENCE SIGNS LIST

1 LASER LIGHT SOURCE
2 LENS FOR EXCITATION(OPTICAL MEMBER)
3 WINDOW PORTION
4 LIGHT EMITTING BODY (OPTICAL MEMBER)
5P HALF PARABOLIC MIRROR (REFLECTING MIRROR, OPTICAL MEMBER)
5h BASE (OPTICAL MEMBER)
6 LASER CUT FILTER(OPTICAL MEMBER)
7a TO 7f FIXING MEMBER
8 PROJECTION LENS(OPTICAL MEMBER)
9 WIRING
9a CONDUCTIVE FILM FORMATION UNIT (WIRING)
9b HEAT GENERATING CONDUCTOR (WIRING)
9c, 9d ENERGIZING PATH (WIRING)
10 HEAD LAMP (LIGHT EMITTING DEVICE, LIGHTING SYSTEM, HEADLIGHT)
11 LD CHIP (SEMICONDUCTOR LASER)
20 SEALING HOUSING (FIXING MEMBER)
21 SEAL (WIRING)
30 LIGHTING CONTROL UNIT
100 LASER DRIVING CIRCUIT
101 LASER CONTROL UNIT
102 LASER DRIVING UNIT

103 OUTPUT SWITCHING ELEMENT
104a, 104b ENERGIZING PATH SWITCHING SWITCH
105 MAIN SWITCHING ELEMENT
106 BYPASS SWITCHING ELEMENT
106a BYPASS SWITCHING ELEMENT GROUP
107 BYPASS SWITCHING ELEMENT
107a BYPASS SWITCHING ELEMENT GROUP
200 VEHICLE (CAR)
1021 COIL
1022 DIODE
1023 CAPACITOR
1024 CURRENT DETECTING RESISTOR
1025 DIFFERENTIAL AMPLIFIER
1026 SWITCHING CONTROL UNIT
1027 DIODE FOR CLAMPING (FIRST SELECTIVE CONDUCTION ELEMENT)
1028 ABNORMAL VOLTAGE PREVENTING SWITCHING ELEMENT (SECOND SELECTIVE CONDUCTION ELEMENT)
bp BYPASS CURRENT PATH
E POWER SOURCE
pa1 PARASITIC INDUCTANCE
pa2 REVERSE VOLTAGE
r BYPASS RESISTOR
S0 TO S7 SIGNAL
SUF1, SUF2 SURFACE
SUF3 LIGHT REFLECTING CONCAVE SURFACE (SURFACE)
SUF4 INNER SURFACE (SURFACE)
T TERMINAL
P REFERENCE POTENTIAL POINT

The invention claimed is:

1. A light emitting device comprising:
a laser light source which includes at least one semiconductor laser;
a wiring that supplies a current to the laser light source; and
at least two optical members including a first optical member and a second optical member which change a state of laser light which is emitted from the laser light source, wherein
a portion of the wiring is installed at a position in which a breakage of the wiring easily occurs due to at least any one deformation of the laser light source, the first optical member, and the second optical member, or a change in an installation position thereof, and
in a portion of the wiring, at least two paths are present, including a path which is connected to a portion of the first optical member at which the breakage easily occurs and a path which is connected to a portion of the second optical member at which the breakage easily occurs.

2. The light emitting device according to claim 1, wherein a portion of the wiring is installed on a surface of at least one of any one of the laser light source, the first optical member, and the second optical member, or in the vicinity thereof.

3. light emitting device according to claim 1, further comprising:
a fixing member that fixes at least any one of the laser light source, the first optical member, and the second optical member,
wherein a portion of the wiring is installed on the surface of the fixing member, or in the vicinity thereof.

4. The light emitting device according to claim 1, wherein a portion of the wiring includes a structure in which a breakage easily occurs.

5. The light emitting device according to claim 1, wherein a portion of the wiring is on a reference potential side.

6. The light emitting device according to claim 1, further comprising:
a bypass current path which bypasses a first electrode and a second electrode of the laser light source; and
a bypass switching element which switches between conduction and non-conduction of the bypass current path,
wherein the bypass switching element causes the bypass current path to be conductive at a time of lights-out of the laser light source.

7. The light emitting device according to claim 1, wherein the laser light source is defined by a plurality of semiconductor lasers which are connected to one another,
the device further comprising:
a plurality of bypass current paths which bypass a first electrode and a second electrode of each of a plurality of semiconductor laser groups, which are the results of the grouping-division of all the plurality of the semiconductor lasers included in the laser light source, into at least any one of a group including only a single semiconductor laser, and a group including two or more semiconductor lasers which are connected to one another; and
a plurality of bypass switching elements which switch between conduction and non-conduction of each of the plurality of bypass current paths,
wherein the bypass switching element causes the bypass current path to be conductive at the time of lights-out of the laser light source.

8. The light emitting device according to claim 1, further comprising:
a first selective conduction element which is selectively conductive between a terminal on a reference potential side and a reference potential point when a potential of the terminal on the reference potential side of the laser light source is higher, or lower than that in the reference potential point.

9. The light emitting device according to claim 1, further comprising:
a second selective conduction element which is selectively conductive between a terminal on a reference potential side and a reference potential point of the laser light source at a predetermined timing.

10. A lighting system comprising:
the light emitting device according to claim 1.

11. A headlight comprising:
the light emitting device according to claim 1.

12. A vehicle comprising:
the headlight according to claim 11.

13. The light emitting device according to claim 2, further comprising:
a fixing member that fixes at least any one of the laser light source, the first optical member, and the second optical member,
wherein a portion of the wiring is installed on the surface of the fixing member, or in the vicinity thereof.

14. The light emitting device according to claim 2,
wherein a portion of the wiring includes a structure in which a breakage easily occurs.

15. The light emitting device according to claim 3,
wherein a portion of the wiring includes a structure in which a breakage easily occurs.

16. The light emitting device according to claim 13,
wherein a portion of the wiring includes a structure in which a breakage easily occurs.

17. The light emitting device according to claim 2,
wherein a portion of the wiring is on a reference potential side.

18. The light emitting device according to claim 2, further comprising:
a bypass current path which bypasses a first electrode and a second electrode of the laser light source; and
a bypass switching element which switches between conduction and non-conduction of the bypass current path,
wherein the bypass switching element causes the bypass current path to be conductive at a time of lights-out of the laser light source.

19. The light emitting device according to claim 2, wherein the laser light source is defined by a plurality of semiconductor lasers which are connected to one another,
the device further comprising:
a plurality of bypass current paths which bypass a first electrode and a second electrode of each of a plurality of semiconductor laser groups, which are the results of the grouping-division of all the plurality of the semiconductor lasers included in the laser light source, into at least any one of a group including only a single semiconductor laser, and a group including by two or more semiconductor lasers which are connected one another; and
a plurality of bypass switching elements which switch between conduction and non-conduction of each of the plurality of bypass current paths, and
the bypass switching element causes the bypass current path to be conductive at the time of lights-out of the laser light source.

20. The light emitting device according to claim 2, further comprising:
a first selective conduction element which is selectively conductive between a terminal on a reference potential side and a reference potential point when a potential of the terminal on the reference potential side of the laser light source is higher, or lower than that in the reference potential point.

* * * * *